US008440314B2

(12) United States Patent
Morton et al.

(10) Patent No.: US 8,440,314 B2
(45) Date of Patent: May 14, 2013

(54) COATED CUTTING TOOLS HAVING A PLATINUM GROUP METAL CONCENTRATION GRADIENT AND RELATED PROCESSES

(75) Inventors: Craig W. Morton, Nolensville, TN (US); Dewitt Dortch, Christiana, TN (US); John Bost, Franklin, TN (US); David J. Wills, Franklin, TN (US)

(73) Assignee: TDY Industries, LLC, Pittsburgh, PA (US)

( * ) Notice: Subject to any disclaimer, the term of this patent is extended or adjusted under 35 U.S.C. 154(b) by 417 days.

(21) Appl. No.: 12/546,944

(22) Filed: Aug. 25, 2009

(65) Prior Publication Data

US 2011/0052931 A1    Mar. 3, 2011

(51) Int. Cl.
*B32B 9/00* (2006.01)
(52) U.S. Cl.
USPC .............. 428/472; 51/307; 51/309; 428/336; 428/469; 428/697; 428/698; 428/699
(58) Field of Classification Search ............ 51/307, 51/309; 428/336, 469, 472, 697, 698, 699
See application file for complete search history.

(56) References Cited

U.S. PATENT DOCUMENTS

| | | | |
|---|---|---|---|
| 2,299,207 A | 10/1969 | Bevillard | |
| 3,471,921 A | 10/1969 | Feenstra | |
| 3,490,901 A | 1/1970 | Hachisuka et al. | |
| 3,581,835 A | 6/1971 | Stebley | |
| 3,628,921 A | 12/1971 | Hill | |
| 3,660,050 A | 5/1972 | Iler et al. | |
| 3,746,456 A | 7/1973 | Hill | |
| 3,757,879 A | 9/1973 | Wilder et al. | |
| 3,785,783 A | 1/1974 | Mynard et al. | |
| 3,806,270 A | 4/1974 | Tanner et al. | |
| 3,854,991 A | 12/1974 | Hale | |
| 3,920,407 A | 11/1975 | Mynard et al. | |
| RE28,645 E | 12/1975 | Aoki et al. | |
| 3,942,954 A | 3/1976 | Frehn | |
| 3,986,653 A | 10/1976 | Gilding | |
| 3,989,558 A | 11/1976 | Mynard et al. | |
| 4,009,027 A | 2/1977 | Naidich et al. | |
| 4,017,480 A | 4/1977 | Baum | |

(Continued)

FOREIGN PATENT DOCUMENTS

AT    268706    2/1969
AU    695583    2/1998

(Continued)

OTHER PUBLICATIONS

"Production Know-How," Metalworking Production, Feb. 1985, p. 40.

(Continued)

*Primary Examiner* — A. A. Turner
(74) *Attorney, Agent, or Firm* — K & L Gates LLP; Patrick J. Viccaro; John E. Grosselin, III

(57) ABSTRACT

The present disclosure is directed to cutting tools. The disclosed cutting tools may have a wear resistant coating on a substrate. The substrate may have hard particles cemented in a binder phase. The binder may have a near-surface concentration gradient of at least one platinum group element and/or rhenium. Processes for producing cutting tools are also disclosed.

21 Claims, 12 Drawing Sheets

U.S. PATENT DOCUMENTS

| | | | |
|---|---|---|---|
| 4,097,275 A | 6/1978 | Horvath | |
| 4,106,382 A | 8/1978 | Salje et al. | |
| 4,126,652 A | 11/1978 | Oohara et al. | |
| 4,170,499 A | 10/1979 | Thomas et al. | |
| 4,268,569 A | 5/1981 | Hale | |
| 4,270,952 A | 6/1981 | Kobayashi | |
| 4,277,106 A | 7/1981 | Sahley | |
| 4,308,059 A | 12/1981 | Rymas | |
| 4,311,490 A | 1/1982 | Bovenkerk et al. | |
| 4,325,994 A | 4/1982 | Kitashima et al. | |
| 4,327,156 A | 4/1982 | Dillon et al. | |
| 4,340,327 A | 7/1982 | Martins | |
| 4,389,952 A | 6/1983 | Dreier et al. | |
| 4,432,794 A | 2/1984 | Holleck | |
| 4,478,297 A | 10/1984 | Radtke | |
| 4,550,532 A | 11/1985 | Fletcher, Jr. et al. | |
| 4,553,615 A | 11/1985 | Grainger | |
| 4,574,011 A | 3/1986 | Bonjour et al. | |
| 4,587,174 A | 5/1986 | Yoshimura et al. | |
| 4,592,685 A | 6/1986 | Beere | |
| 4,604,106 A | 8/1986 | Hall | |
| 4,605,343 A | 8/1986 | Hibbs, Jr. et al. | |
| 4,609,577 A | 9/1986 | Long | |
| 4,610,931 A | 9/1986 | Nemeth et al. | |
| 4,642,003 A | 2/1987 | Yoshimura | |
| 4,649,086 A | 3/1987 | Johnson | |
| 4,686,156 A | 8/1987 | Baldoni, II et al. | |
| 4,722,405 A | 2/1988 | Langford | |
| 4,729,789 A | 3/1988 | Ide et al. | |
| 4,734,339 A | 3/1988 | Schachner et al. | |
| 4,743,515 A | 5/1988 | Fischer et al. | |
| 4,749,053 A | 6/1988 | Hollingshead | |
| 4,861,350 A | 8/1989 | Phaal et al. | |
| 4,923,512 A | 5/1990 | Timm et al. | |
| 4,956,012 A | 9/1990 | Jacobs et al. | |
| 5,041,261 A | 8/1991 | Buljan et al. | |
| RE33,753 E | 11/1991 | Vacchiano et al. | |
| 5,067,860 A | 11/1991 | Kobayashi et al. | |
| 5,098,232 A | 3/1992 | Benson | |
| 5,110,687 A | 5/1992 | Abe et al. | |
| 5,135,801 A | 8/1992 | Nyström et al. | |
| 5,174,700 A | 12/1992 | Sgarbi et al. | |
| 5,179,772 A | 1/1993 | Braun et al. | |
| 5,186,739 A | 2/1993 | Isobe et al. | |
| 5,203,513 A | 4/1993 | Keller et al. | |
| 5,203,932 A | 4/1993 | Kato et al. | |
| 5,250,367 A | 10/1993 | Santhanam et al. | |
| 5,266,415 A | 11/1993 | Newkirk et al. | |
| 5,273,380 A | 12/1993 | Musacchia | |
| 5,281,260 A | 1/1994 | Kumar et al. | |
| 5,305,840 A | 4/1994 | Liang et al. | |
| 5,326,196 A | 7/1994 | Noll | |
| 5,333,520 A | 8/1994 | Fischer et al. | |
| 5,348,806 A | 9/1994 | Kojo et al. | |
| 5,359,772 A | 11/1994 | Carlsson et al. | |
| 5,376,329 A | 12/1994 | Morgan et al. | |
| 5,423,899 A | 6/1995 | Krall et al. | |
| 5,438,858 A | 8/1995 | Friedrichs | |
| 5,441,693 A * | 8/1995 | Ederyd et al. | 419/10 |
| 5,462,013 A | 10/1995 | Punola et al. | |
| 5,467,669 A | 11/1995 | Stroud | |
| 5,476,531 A | 12/1995 | Timm et al. | |
| 5,482,670 A | 1/1996 | Hong | |
| 5,484,468 A | 1/1996 | Östlund et al. | |
| 5,505,748 A | 4/1996 | Tank et al. | |
| 5,525,134 A | 6/1996 | Mehrotra et al. | |
| 5,541,006 A | 7/1996 | Conley | |
| 5,543,235 A | 8/1996 | Mirchandani et al. | |
| 5,570,978 A | 11/1996 | Rees et al. | |
| 5,580,666 A | 12/1996 | Dubensky et al. | |
| 5,590,729 A | 1/1997 | Cooley et al. | |
| 5,593,474 A | 1/1997 | Keshavan et al. | |
| 5,603,075 A * | 2/1997 | Stoll et al. | 75/240 |
| 5,609,447 A | 3/1997 | Britzke et al. | |
| 5,612,264 A | 3/1997 | Nilsson et al. | |
| 5,628,837 A | 5/1997 | Britzke et al. | |
| RE35,538 E | 6/1997 | Akesson et al. | |
| 5,635,247 A | 6/1997 | Ruppi | |
| 5,658,678 A | 8/1997 | Stoll et al. | |
| 5,665,431 A | 9/1997 | Narasimhan | |
| 5,677,042 A | 10/1997 | Massa et al. | |
| 5,679,445 A | 10/1997 | Massa et al. | |
| 5,686,119 A | 11/1997 | McNaughton, Jr. | |
| 5,697,042 A | 12/1997 | Massa et al. | |
| 5,718,948 A | 2/1998 | Ederyd et al. | |
| 5,733,649 A | 3/1998 | Kelley et al. | |
| 5,733,664 A | 3/1998 | Kelley et al. | |
| 5,750,247 A | 5/1998 | Bryant et al. | |
| 5,755,033 A | 5/1998 | Gunter et al. | |
| 5,762,843 A | 6/1998 | Massa et al. | |
| 5,776,593 A | 7/1998 | Massa et al. | |
| 5,778,301 A | 7/1998 | Hong | |
| 5,789,686 A | 8/1998 | Massa et al. | |
| 5,792,403 A | 8/1998 | Massa et al. | |
| 5,802,955 A | 9/1998 | Stoll et al. | |
| 5,806,934 A | 9/1998 | Massa et al. | |
| 5,830,256 A | 11/1998 | Northrop et al. | |
| 5,856,626 A | 1/1999 | Fischer et al. | |
| 5,863,640 A | 1/1999 | Ljungberg et al. | |
| 5,880,382 A | 3/1999 | Fang et al. | |
| 5,935,351 A | 8/1999 | Sherman et al. | |
| 5,948,541 A | 9/1999 | Inspektor | |
| 5,967,249 A | 10/1999 | Butcher | |
| 5,976,707 A * | 11/1999 | Grab | 51/307 |
| 6,007,909 A | 12/1999 | Rolander et al. | |
| 6,022,175 A | 2/2000 | Heinrich et al. | |
| 6,086,003 A | 7/2000 | Gunter et al. | |
| 6,089,123 A | 7/2000 | Chow et al. | |
| 6,209,420 B1 | 4/2001 | Butcher et al. | |
| 6,214,247 B1 | 4/2001 | Leverenz et al. | |
| 6,214,287 B1 | 4/2001 | Waldenström | |
| 6,217,992 B1 | 4/2001 | Grab | |
| 6,220,117 B1 | 4/2001 | Butcher | |
| 6,228,139 B1 | 5/2001 | Oskarrson | |
| 6,254,658 B1 | 7/2001 | Taniuchi et al. | |
| 6,287,360 B1 | 9/2001 | Kembaiyan et al. | |
| 6,290,438 B1 | 9/2001 | Papajewski | |
| 6,293,986 B1 | 9/2001 | Rödiger et al. | |
| 6,299,658 B1 | 10/2001 | Moriguchi et al. | |
| 6,350,510 B1 | 2/2002 | König et al. | |
| 6,352,627 B2 | 3/2002 | Leyendecker et al. | |
| 6,353,771 B1 | 3/2002 | Southland | |
| 6,372,346 B1 | 4/2002 | Toth | |
| 6,374,932 B1 | 4/2002 | Brady | |
| 6,395,108 B2 | 5/2002 | Eberle et al. | |
| 6,425,716 B1 | 7/2002 | Cook | |
| 6,447,890 B1 | 9/2002 | Leverenz et al. | |
| 6,450,739 B1 | 9/2002 | Puide et al. | |
| 6,502,623 B1 | 1/2003 | Schmitt | |
| 6,511,265 B1 | 1/2003 | Mirchandani et al. | |
| 6,514,456 B1 | 2/2003 | Lackner et al. | |
| 6,521,172 B2 | 2/2003 | Grearson et al. | |
| 6,544,308 B2 | 4/2003 | Griffin et al. | |
| 6,554,548 B1 | 4/2003 | Grab et al. | |
| 6,562,462 B2 | 5/2003 | Griffin et al. | |
| 6,585,064 B2 | 7/2003 | Griffin et al. | |
| 6,617,058 B2 | 9/2003 | Schier | |
| 6,620,375 B1 | 9/2003 | Tank et al. | |
| 6,638,609 B2 | 10/2003 | Nordgren et al. | |
| 6,655,882 B2 * | 12/2003 | Heinrich et al. | 407/119 |
| 6,660,371 B1 | 12/2003 | Westphal et al. | |
| 6,676,863 B2 | 1/2004 | Christiaens et al. | |
| 6,685,880 B2 | 2/2004 | Engström et al. | |
| 6,719,074 B2 | 4/2004 | Tsuda et al. | |
| 6,723,389 B2 | 4/2004 | Kobayashi et al. | |
| 6,737,178 B2 | 5/2004 | Ota et al. | |
| 6,764,555 B2 | 7/2004 | Hiramatsu et al. | |
| 6,827,975 B2 | 12/2004 | Leverenz et al. | |
| 6,830,604 B2 | 12/2004 | Grearson et al. | |
| 6,844,085 B2 | 1/2005 | Takayama et al. | |
| 6,848,521 B2 | 2/2005 | Lockstedt et al. | |
| 6,869,334 B1 | 3/2005 | Leyendecker et al. | |
| 6,884,496 B2 | 4/2005 | Westphal et al. | |
| 6,892,793 B2 | 5/2005 | Liu et al. | |
| 6,911,063 B2 | 6/2005 | Liu | |
| 6,929,851 B1 | 8/2005 | Leverenz et al. | |
| 6,949,148 B2 | 9/2005 | Sugiyama et al. | |

| | | | |
|---|---|---|---|
| 6,955,233 B2 | 10/2005 | Crowe et al. | |
| 6,958,099 B2 | 10/2005 | Nakamura et al. | |
| 7,014,719 B2 | 3/2006 | Suzuki et al. | |
| 7,014,720 B2 | 3/2006 | Iseda | |
| 7,070,666 B2 | 7/2006 | Druschitz et al. | |
| 7,090,731 B2 | 8/2006 | Kashima et al. | |
| 7,101,446 B2 | 9/2006 | Takeda et al. | |
| 7,125,207 B2 | 10/2006 | Craig et al. | |
| 7,128,773 B2 | 10/2006 | Liang et al. | |
| 7,175,404 B2 | 2/2007 | Kondo et al. | |
| 7,207,750 B2 | 4/2007 | Annanolli et al. | |
| 7,238,414 B2 | 7/2007 | Benitsch et al. | |
| 7,244,519 B2 | 7/2007 | Festeau et al. | |
| 7,250,069 B2 | 7/2007 | Kembaiyan et al. | |
| 7,267,543 B2 | 9/2007 | Freidhoff et al. | |
| 7,381,283 B2 | 6/2008 | Lee et al. | |
| 7,384,413 B2 | 6/2008 | Gross et al. | |
| 7,384,443 B2 | 6/2008 | Mirchandani et al. | |
| 7,410,610 B2 | 8/2008 | Woodfield et al. | |
| 7,497,396 B2 | 3/2009 | Splinter et al. | |
| 7,513,320 B2 | 4/2009 | Mirchandani et al. | |
| 7,625,157 B2 | 12/2009 | Prichard et al. | |
| 7,687,156 B2 * | 3/2010 | Fang et al. | 428/698 |
| 7,846,551 B2 * | 12/2010 | Fang et al. | 428/472 |
| 8,007,922 B2 | 8/2011 | Mirchandani et al. | |
| 8,025,112 B2 | 9/2011 | Mirchandani et al. | |
| 2003/0010409 A1 | 1/2003 | Kunze et al. | |
| 2003/0041922 A1 | 3/2003 | Hirose et al. | |
| 2003/0219605 A1 | 11/2003 | Molian et al. | |
| 2004/0105730 A1 | 6/2004 | Nakajima | |
| 2004/0234820 A1 | 11/2004 | Majagi | |
| 2005/0103404 A1 | 5/2005 | Hsieh et al. | |
| 2005/0194073 A1 | 9/2005 | Hamano et al. | |
| 2005/0211475 A1 | 9/2005 | Mirchandani et al. | |
| 2005/0247491 A1 | 11/2005 | Mirchandani et al. | |
| 2006/0060392 A1 | 3/2006 | Eyre | |
| 2006/0286410 A1 | 12/2006 | Ahlgren et al. | |
| 2007/0082229 A1 | 4/2007 | Mirchandani et al. | |
| 2007/0126334 A1 | 6/2007 | Nakamura et al. | |
| 2007/0163679 A1 | 7/2007 | Fujisawa et al. | |
| 2007/0193782 A1 | 8/2007 | Fang et al. | |
| 2008/0011519 A1 | 1/2008 | Smith et al. | |
| 2008/0101977 A1 | 5/2008 | Eason et al. | |
| 2008/0163723 A1 | 7/2008 | Mirchandani et al. | |
| 2008/0196318 A1 * | 8/2008 | Bost et al. | 51/295 |
| 2008/0302576 A1 | 12/2008 | Mirchandani et al. | |
| 2009/0041612 A1 | 2/2009 | Fang et al. | |
| 2009/0136308 A1 | 5/2009 | Newitt | |
| 2009/0180915 A1 | 7/2009 | Mirchandani et al. | |
| 2009/0293672 A1 | 12/2009 | Mirchandani et al. | |
| 2010/0044114 A1 | 2/2010 | Mirchandani et al. | |
| 2010/0044115 A1 | 2/2010 | Mirchandani et al. | |
| 2010/0290849 A1 | 11/2010 | Mirchandani et al. | |
| 2010/0303566 A1 | 12/2010 | Fang et al. | |
| 2011/0011965 A1 | 1/2011 | Mirchandani et al. | |

FOREIGN PATENT DOCUMENTS

| | | |
|---|---|---|
| CA | 2212197 C | 10/2000 |
| CH | 647813 A5 | 2/1985 |
| DE | 27 19 532 A1 | 11/1977 |
| EP | 0157625 A2 | 10/1985 |
| EP | 0264674 A2 | 4/1988 |
| EP | 0453428 A1 | 10/1991 |
| EP | 0995876 A2 | 4/2000 |
| EP | 1077783 B1 | 2/2001 |
| EP | 1106706 A1 | 6/2001 |
| EP | 0759480 B1 | 1/2002 |
| EP | 1686193 A2 | 8/2006 |
| EP | 1198609 B2 | 10/2007 |
| GB | 622041 | 4/1949 |
| GB | 1082568 | 9/1967 |
| GB | 1309634 | 3/1973 |
| GB | 1393115 | 5/1975 |
| GB | 1393116 | 5/1975 |
| GB | 1420906 | 1/1976 |
| GB | 1491044 | 11/1977 |
| GB | 2158744 A | 11/1985 |
| GB | 2352727 A | 2/2001 |
| GB | 2393449 A | 3/2004 |
| GB | 2435476 A | 8/2007 |
| JP | 59-175912 A | 10/1984 |
| JP | 61-243103 A | 10/1986 |
| JP | 61-261453 | 11/1986 |
| JP | 61-261455 | 11/1986 |
| JP | 62-063005 A | 3/1987 |
| JP | 2-269515 A | 11/1990 |
| JP | 5-50314 A | 3/1993 |
| JP | H03-119090 U | 6/1995 |
| JP | 8-120308 A | 5/1996 |
| JP | H8-209284 | 8/1996 |
| JP | 10219385 A | 8/1998 |
| JP | 11-300516 A | 11/1999 |
| JP | 2002-097885 A | 4/2002 |
| JP | 2002-166326 A | 6/2002 |
| JP | 2002-254144 A | 9/2002 |
| JP | 2002-317596 A | 10/2002 |
| JP | 2003-306739 | 10/2003 |
| JP | 2004-181604 | 7/2004 |
| JP | 2004-190034 A | 7/2004 |
| JP | 2005-111581 | 4/2005 |
| RU | 2135328 C1 | 8/1999 |
| RU | 2200209 C2 | 3/2003 |
| SU | 1292917 A1 | 2/1987 |
| SU | 1350322 | 11/1987 |
| WO | WO 92/05009 A1 | 4/1992 |
| WO | WO 99/13121 A1 | 3/1999 |
| WO | WO 00/52217 | 9/2000 |
| WO | WO 00/73532 A1 | 12/2000 |
| WO | WO 03/010350 A1 | 2/2003 |
| WO | WO 2005/045082 A1 | 5/2005 |
| WO | WO 2005/054530 A1 | 6/2005 |
| WO | WO 2005/061746 A1 | 7/2005 |
| WO | WO 2006/023222 A | 3/2006 |
| WO | WO 2006/071192 A1 | 7/2006 |
| WO | WO 2006/104004 A1 | 10/2006 |
| WO | WO 2007/001870 A2 | 1/2007 |
| WO | WO 2007/022336 A1 | 2/2007 |
| WO | WO 2007/030707 A1 | 3/2007 |
| WO | WO 2007/044791 A1 | 4/2007 |
| WO | WO 2007/127680 A1 | 11/2007 |
| WO | WO 2008/098636 A1 | 8/2008 |
| WO | WO 2008/103605 A2 | 8/2008 |
| WO | WO 2008/115703 A1 | 9/2008 |
| WO | WO 2011/008439 A2 | 1/2011 |

OTHER PUBLICATIONS

"Ruthenium Boosts Carbide's Capability," Metalworking Production, Jun. 1978, p. 13.

"Ruthenium-Containing Carbide Tips Extend the Life of Cutting Tools," Inco Europe Limited, London, May 1978.

Bonjour, Christian, "Effects of Ruthenium Additions on the Properties and Machining Behaviour of WC-Co Hard Metals," Uni. of App. Sciences of West. Switz., Euro PM2004.

Bonjour, C., "Nouveaux Developpements Dans Les Outils De Coupe en Carbure Fritte," Wear, 62(1980) pp. 83-122, the Netherlands.

Brookes, Ken, "Functional Design Puts the Bite into Hard and Refractory Metals," metal-powder.net, Nov. 2003, pp. 20-25.

Brookes, Ken, "Higher Speed Metals—Alias Carbides," MPR, Aug. 1982, pp. 411, 412, 414.

Brookes, Ken, "Phase Inhibition and Residual Stresses," metal-powder.net, Mar. 2003, pp. 22-23.

Brookes, Ken, "Ruthenium Exploits its Precious Talent," Metalworking Production, Jul. 1979, pp. 77, 78, 80.

Brookes, Ken, "Stellram Continues Hardmetal Development," MPR, Nov. 1994, pp. 28-31.

Jackson, J.S., et al., "Cemented Carbides with High Melting-Point Precious-Metal Binder Phases," Powder Metallurgy Limited, 1974, pp. 255-269.

Lisovskii, A.F., "Cemented Carbides Alloyed with Ruthenium, Osmium, and Rhenium," Powder Metallurgy and Metal Ceramics, vol. 39, Nos. 9-10, 2000, pp. 428-433.

Lisovsky, A.F., "Some Problems on Technical Use of the Phenomenon of Metal Melts Imbibition of Sintered Composites," Powder Metallurgy Intl, vol. 21, No. 6, 1989, pp. 7-9.

Lisovsky, A.F., et al., "On the Use of the MMI-Phenomenon for the Formation of Nanostructures in WC-Co Cemented Carbides," Int. J. of Refractory Metals & Hard Materials 15(1997) 227-235, Great Britain.

Luyckx, S., "High Temperature Hardness of WC-Co-Ru," Journal of Materials Science Letters 21, 2002, 1681-1682.

Shing, T.L., et al., "The Effect of Ruthenium Additions on the Hardness, Toughness and Grain Size of WC-Co," Int. J. of Refractory Metals & Hard Materials 19(2001) 41-44.

Panteleev, I.B., "Oxidation Resistance and High-Temperature Strength of WC-Co-Ni-Re (Mn) Hard Alloys," Powder Metallurgy and Metal Ceramics, vol. 45, Nos. 7-8, 2006, 342-345.

Penrice, T.W., "Alternative Binders for Hard Metals," Carbide and Tool Journal, July/August, pp. 12-15.

Penrice, T.W., "Some Characteristics of the Binder Phase in Cemented Carbides," Int. J. of Refractory Metals & Hard Materials 15(1997) 113-121.

"Ruthenium and Refractory Carbides—Titanium Carbide Composites of Remarkable Stability," Platinum Metals Rev., 1974, 18(1), 27-28.

"Ruthenium as a Binder for Cemented Carbides," Platinum Metals Rev., 1974, 18, (4), p. 129.

"Stellram to Produce Ruthenium-Containing Hardmetal," p. 435.

Tracey, V.A., "Development of Tungsten Carbide-Cobalt-Ruthenium Cutting Tools for Machining Steels," Inco European Research and Development Centre, pp. 281-292, U.K.

Warren, R., et al., "The Microstructure and Properties of Sintered TiC-Ruthenium Alloys," Powder Metallurgy International, vol. 7, No. 1, 1975, pp. 18-21.

Coyle, T.W. and A. Bahrami, "Structure and Adhesion of Ni and NI-WC Plasma Spray Coatings," Thermal Spray, Surface Engineering via Applied Research, Proceedings of the 1st International Thermal Spray Conference, May 8-11, 2000, Montreal, Quebec. Canada, 2000, pp. 251-254.

Deng, X. et al., "Mechanical Properties of a Hybrid Cemented Carbide Composite," International Journal of Refractory Metals and Hard Materials, Elsevier Science Ltd., vol. 19, 2001, pp. 547-552.

Gurland, Joseph, "Application of Quantitative Microscopy to Cemented Carbides," Practical Applications of Quantitative Melatellography, ASTM Special Technical Publication 839, ASTM 1984, pp. 65-84.

Hayden, Matthew and Lyndon Scott Stephens, "Experimental Results for a Heat-Sink Mechanical Seal," Tribology Transactions, 48. 2005, pp. 352-361.

Peterman, Walter, "Heat-Sink Compound Protects the Unprotected," Welding Design and Fabrication, Sep. 2003, pp. 20-22.

Shi et al., "Composite Ductility—The Role of Reinforcement and Matrix", TMS Meeting, Las Vegas, NV, Feb. 12-16, 1995, 10 pages.

Underwood, *Quantitative Stereology*, pp. 23-108 (1970).

Vander Vort, "Introduction to Quantitative Metallography", Tech Notes, vol. 1, Issue 5, published by Buehler, Ltd. 1997, 6 pages.

J. Gurland, *Quantitative Microscopy*, R.T. DeHoff and F.N. Rhines, eds., McGraw-Hill Book Company, New York, 1968, pp. 279-290.

You Tube, "The Story Behind Kennametal's Beyond Blast", dated Sep. 14, 2010, http://www.youtube.com/watch?v=8_A-bYVwmU8 (3 pages) accessed on Oct. 14, 2010.

Kennametal press release on Jun. 10, 2010, http://news.thomasnet.com/companystory/Kennametal-Launches-Beyond-BLAST-TM-at-IMTS-2010-Booth-W-1522-833445 (2 pages) accessed on Oct. 14, 2010.

Pages from Kennametal site, http://www.kennametal.com/en-US/promotions/Beyond_Blast.jhtml (7 pages) accessed on Oct. 14, 2010.

ASM Materials Engineering Dictionary, J.R. Davis, Ed., ASM International, Fifth printing, Jan. 2006, p. 98.

Childs et al., "Metal Machining", 2000, Elsevier, p. 111.

Brookes, Kenneth J. A., "World Directory and Handbook of Hardmetals and Hard Materials", International Carbide Data, U.K. 1996, Sixth Edition, p. 42.

Firth Sterling grade chart, Allegheny Technologies. attached to Declaration of Prakash Mirchandani, Ph.D as filed in U.S. Appl. No. 11/737,993 on Sep. 9, 2009.

Metals Handbook Desk Edition, definition of 'wear', 2nd Ed., J.R. Davis, Editor, ASM International 1998, p. 62.

McGraw-Hill Dictionary of Scientific and Technical Terms, 5th Edition, Sybil P. Parker, Editor in Chief, 1993, pp. 799, 800, 1933, and 2047.

ProKon Version 8.6, The Calculation Companion, Properties for W, Ti, Mo, Co, Ni and Fe, Copyright 1997-1998, 6 pages.

TIBTECH Innovations, "Properties table of stainless steel, metals and other conductive materials", printed from http://www.tibtech.com/conductivity.php on Aug. 19, 2011, 1 page.

"Material: Tungsten Carbide (WC), bulk", MEMSnet, printed from http://www.memsnet.org/material/tungstencarbidewcbulk/ on Aug. 19, 2001, 1 page.

Williams, Wendell B., "The Thermal Conductivity of Metallic Ceramics", JOM, Jun. 1998, pp. 62-66.

Brookes, Kenneth J. A., "World Directory and Handbook of Hardmetals and Hard Materials", International Carbide Data, U.K. 1996, Sixth Edition, pp. D182-D184.

Thermal Conductivity of Metals, The Engineering ToolBox, printed from http://www.engineeringtoolbox.com/thermal-conductivity-metals-d_856.html on Oct. 27, 2011, 3 pages.

Blernat, "Coating can greatly enhance carbide tool life and performance, but only if they stay in place," Cutting Tool Engineering, 47(2), Mar. 1995.

Brooks, World Dictionary and Handbook of Hardmetals and Hard Materials, International Carbide Data, Sixth edition, 1996, p. D194.

Tonshoff et al., "Surface treatment of cutting tool substrates," Int. J. Tools Manufacturing, 38(5-6), 1998, 469-476.

Bouzakis et al., "Improvement of PVD Coated Inserts Cutting Performance Through Appropriate Mechanical Treatments of Substrate and Coating Surface", Surface and Coatings Technology, 2001, 146-174; pp. 443-490.

Destefani, "Cutting tools 101: Coatings," Manufacturing Engineering, 129(4), 2002, 5 pages.

Santhanam, et al., "Comparison of the Steel-Milling Performance of Carbide Inserts with MTCVD and PVD TiCN Coatings", Int. J. of Refractory Metals & Hard Materials, vol. 14, 1996, pp. 31-40.

Wolfe et al., "The Role of Hard Coating in Carbide Milling Tools", J. Vacuum Science Technology, vol. 4, No. 6, Nov./Dec. 1986, pp. 2747-2754.

Qunito, "Mechanical Property and Sstructure Relationship in Hard Coatings for Cutting Tools", J. Vacuum Science Technology, vol. 6, No. 3, May/Jun. 1988, pp. 2149-2157.

Sriram, et al., "Effect of Cerium Addition on Microstructures of Carbon-Alloyed Iron Aluminides," Bull. Mater. Sci., vol. 28, No. 6, Oct. 2005, pp. 547-557.

U.S. Appl. No. 13/286,355, filed Nov. 1, 2011.

US 4,966,627, 10/1990, Keshavan et al. (withdrawn)

\* cited by examiner

COATED CUTTING TOOLS HAVING A PLATINUM GROUP METAL CONCENTRATION GRADIENT AND RELATED PROCESSES

TECHNICAL FIELD

The present disclosure is directed to metalworking tools, such as, for example, cutting tools, including a coating on a substrate such as a cemented carbide material. The present disclosure is also directed to processes for producing cutting tools including a coating on a substrate.

BACKGROUND

Cutting tools and cutting inserts composed of cemented hard particles are employed in machining operations, such as, for example, cutting, drilling, reaming, countersinking, counterboring, milling, turning, grooving, threading, and tapping. As used herein, "cemented hard particles" and a "cemented hard particle material" refer to a material comprising relatively hard particles dispersed and cemented within a relatively soft metallic binder. An example of a cemented hard particle material is a cemented carbide material. Also as used herein, a "cemented" article is an article comprising a cemented hard particle material. A process for manufacturing cemented cutting tools may involve consolidating metallurgical powder (e.g., a mixture of hard particles and metal binder powder) to form a compact. The compact may be sintered to form a tool blank having a solid monolithic construction. After sintering, a cemented tool blank may be machined to form one or more cutting edges or other features of the particular cutting geometry desired on the tool.

Cemented cutting tools comprising hard particles cemented in a binder are industrially important because of the combination of tensile strength, wear resistance, and toughness that is characteristic of these materials. The hard particles may comprise, for example, carbides, nitrides, borides, silicides, or oxides of elements within groups IIIA, and IVB through VIB of the periodic table. An example is tungsten carbide. The binder may be a metal or metal alloy, for example, cobalt, nickel, iron or alloys of these metals. The binder cements the hard particles within a continuous and interconnected matrix.

The physical and chemical properties of cemented materials depend in part on the individual components of the metallurgical powders used to form the materials. The properties of cemented hard particle materials may depend upon the chemical composition of the hard particles, the average particle size and particle size distribution of the hard particles, the chemical composition of the binder, and the ratio of binder to hard particles in the substrate, for example.

Tungsten carbide hard particles cemented in a cobalt binder is a common cemented carbide material that finds utility in metalworking tools, such as, for example, turning tools and inserts, milling tools and inserts, drilling tools and inserts, threading tools and inserts, and grooving tools and inserts (collectively, "cutting tools"). As used herein, the term "cutting tools" includes monolithic cutting tools and inserts for modular cutting tools.

SUMMARY

Embodiments disclosed herein are directed to a cutting tool. The cutting tool comprises a substrate and at least one wear resistant coating on at least a portion of the substrate. The substrate comprises hard particles and a binder. The binder comprises a near-surface concentration gradient of at least one platinum group metal and/or rhenium.

Other embodiments disclosed herein are directed to a process for producing a cutting tool. The process comprises depositing at least one platinum group metal and/or rhenium onto at least a portion of a surface of a substrate. The substrate comprises hard particles and a binder. The substrate having at least one platinum group metal deposited thereon is heated at a temperature and for a time sufficient to cause at least one platinum group metal and/or rhenium to diffuse into the binder. At least one platinum group metal diffused into the binder forms a near-surface platinum group metal concentration gradient in the binder.

It is understood that the invention is not limited to the embodiments disclosed in this Summary. The invention is intended to cover modifications and other subject matter that are within the scope of the invention as defined solely by the claims.

BRIEF DESCRIPTION OF THE DRAWINGS

Certain characteristics of the disclosed non-limiting embodiments may be better understood by reference to the accompanying figures.

FIG. 1A is a perspective view of the cutting insert; FIG. 1B is a top view of the cutting insert; and FIG. 1C is a side view of the cutting insert.

DETAILED DESCRIPTION

Figure 1A:
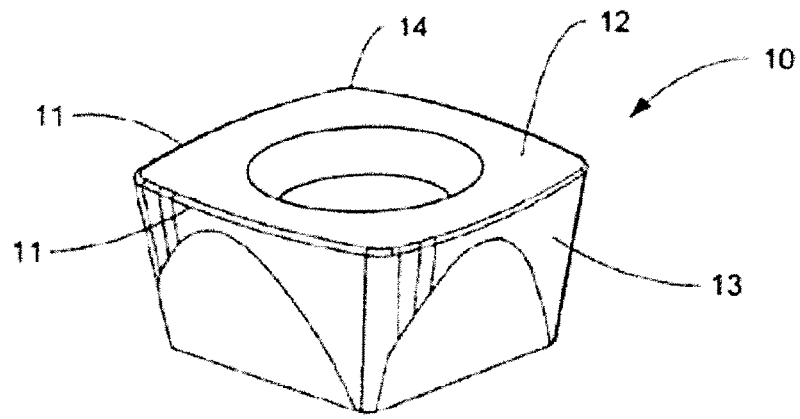
FIGS. 1A, 1B, and 1C are drawings illustrating a non-limiting embodiment of a cutting insert designated XDLW120508SR-D according to ASTM/ISO Standards.

It is to be understood that certain descriptions of the disclosed embodiments have been simplified to illustrate only those elements, features and aspects that are relevant to a clear understanding of the disclosed embodiments, while eliminating, for purposes of clarity, other elements, features and aspects. Persons having ordinary skill in the art, upon considering the present description of the disclosed embodiments, will recognize that other elements and/or features may be desirable in a particular implementation or application of the disclosed embodiments. However, because such other elements and/or features may be readily ascertained by persons having ordinary skill upon considering the present description of the disclosed embodiments, and are not necessary for a complete understanding of the disclosed embodiments, a description of such elements and/or features is not provided herein. As such, it is to be understood that the description set forth herein is merely exemplary and illustrative of the disclosed embodiments and is not intended to limit the scope of the invention as defined solely by the claims.

In the present disclosure, other than where otherwise indicated, all numbers expressing quantities or characteristics are to be understood as being prefaced and modified in all instances by the term "about." Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Also, any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10. Any maximum numerical limitation recited herein is intended to include all lower numerical limitations subsumed therein and any minimum numerical limitation recited herein is intended to include all higher numerical limitations subsumed therein. Accordingly, Applicant(s) reserves the right to amend the present disclosure, including the claims, to expressly recite any sub-range subsumed within the ranges expressly recited herein. All such ranges are intended to be inherently disclosed herein such that amending to expressly recite any such sub-ranges would comply with the requirements of 35 U.S.C. §112, first paragraph, and 35 U.S.C. §132(a).

The grammatical articles "one", "a", "an", and "the", as used herein, are intended to include "at least one" or "one or more", unless otherwise indicated. Thus, the articles are used herein to refer to one or more than one (i.e., to at least one) of the grammatical objects of the article. By way of example, "a component" means one or more components, and thus, possibly, more than one component is contemplated and may be employed or used.

Any patent, publication, or other disclosure material, in whole or in part, that is said to be incorporated by reference herein, is incorporated herein in its entirety, but only to the extent that the incorporated material does not conflict with existing definitions, statements, or other disclosure material expressly set forth in this disclosure. As such, and to the extent necessary, the express disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

Cemented carbides are metal-matrix composites comprising carbides of one or more of the transition metals as hard particles dispersed and cemented in a binder of, for example, cobalt, nickel, and/or iron (or alloys of these metals). In this manner, the hard particles form a dispersed phase and the binder forms a continuous phase. Cemented carbides offer attractive combinations of strength, toughness, and abrasion/erosion (i.e., wear) resistance for use as cutting tools, including, for example, turning inserts and milling inserts. Among the different possible hard particle combinations, cemented carbides comprising tungsten carbide as the hard particle and cobalt as the binder phase are common choices for cutting tools for metalworking operations on difficult to machine materials, such as, for example, titanium and titanium alloys, nickel and nickel alloys, superalloys, stainless steels, and ductile iron.

Two modes of failure in cemented carbide cutting tools are cracking due to mechanical shock and cracking due to thermal shock. These failure modes are encountered, for example, in turning inserts and milling inserts. Mechanical shock is commonly encountered in milling applications, turning applications with interrupted cuts, and in any machining application where there is less than optimum rigidity in the machine or workpiece (e.g., turbine blade machining). Thermal shock is commonly encountered in difficult machining operations such as high productivity machining processes and machining materials with low thermal conductivity and high yield stress values. The use of coolants to avoid thermal deformation of the cutting tool may have the undesired effect of increasing the amount of thermal shock.

In milling applications, cutting tools experience thermal cycling during each rotation of the milling cutter body. As the inserts enter and exit the work material on each rotation, the insert heats up when it is cutting material and cools when it is not cutting material. The use of coolant during milling operations exacerbates the magnitude of the thermal shock. The increased thermal shock due to the larger temperature transitions during thermal cycling may lead to insert failure through thermal fatigue. During thermal cycling of the inserts, the differences in thermal expansion between different parts of the insert initiate the formation and cause the successive propagation of cracks in the substrate.

Two other modes of failure in cutting tools are thermal deformation and abrasive wear. Since the temperature of the cutting edge of a cutting insert may exceed 1000° C., the binder may lose its strength and begin to deform during the cutting operation. Wear resistant coatings may help to thermally insulate the substrate from the high temperatures; however, the substrate may still reach temperatures at which it begins to deform due to a lack of hot hardness of the binder material. Adding a higher melting temperature element or alloy to the binder may increase its hot hardness and help to avoid thermal deformation. The increase in hot hardness may also help to minimize abrasive wear if a wear resistant coating is eroded and exposes the substrate.

The use of at least one platinum group element and/or rhenium in the binder of a cemented hard particle material may improve the performance of cemented cutting tools. The platinum group elements (group VIIIB of the periodic table of the elements) and rhenium (group VIIB) are hard, lustrous, whitish metals that have relatively high melting points. The platinum group elements are sometimes referred to as "noble metals" because they exhibit very low reactivity with other elements and they do not tarnish at room temperature. The platinum group elements and rhenium are also corrosion resistant and do not readily form carbides in solid solutions. These characteristics allow the platinum group elements and rhenium to modify the binder phase in a cemented hard particle substrate, such as, for example, a cemented carbide substrate, without interfering with the carbon balance in the substrate. Solid solution strengthening may occur with addition of at least one platinum group element and/or rhenium to the binder of a cemented carbide, thereby improving fracture toughness and hardness of the cemented substrate.

The platinum group elements and rhenium have melting point temperatures well above those of the base materials of typical binders of cemented hard particle materials. Binders with platinum group element and/or rhenium additions may exhibit an increase in thermal deformation resistance. Selected properties of certain platinum group elements, rhenium, and typical binder base materials are presented in Table 1.

TABLE 1

| Element | Atomic Number | Melting Point (° C.) | Density (g/cm$^3$) | Atomic Radius (Å) | Crystal Structure |
| --- | --- | --- | --- | --- | --- |
| Ruthenium | 44 | 2310 | 12.30 | 1.89 | HCP |
| Rhodium | 45 | 1966 | 12.40 | 1.83 | FCC |
| Palladium | 46 | 1554 | 12.02 | 1.79 | FCC |
| Rhenium | 75 | 3180 | 20.53 | 1.97 | HCP |
| Osmium | 76 | 2700 | 22.48 | 1.92 | HCP |
| Iridium | 77 | 2410 | 22.42 | 1.97 | FCC |
| Platinum | 78 | 1772 | 21.45 | 1.83 | FCC |
| Iron | 26 | 1538 | 7.87 | 1.26 | BCC |
| Cobalt | 27 | 1495 | 8.90 | 1.25 | HCP/FCC |
| Nickel | 28 | 1453 | 8.91 | 1.24 | FCC |

Non-limiting embodiments disclosed herein are directed to cutting tools comprising a coated substrate. The substrate may comprise a cemented hard particle material, which includes hard particles and a binder. The binder may comprise a base material and a near-surface concentration gradient of at least one platinum group metal diffused into the base material.

As used herein, the term "platinum group metal(s)" (and the acronym "PGM(s)") includes the metals in groups VIIB and VIIIB of the periodic table of the elements. PGMs include, for example, platinum, palladium, iridium, rhodium, osmium, ruthenium, solid solutions of any of these metals, and alloys of any of these metals. In addition, in order to simplify the present description, as used herein, the term "platinum group metal(s)" and the acronym "PGM(s)" also includes the group VIIB metal rhenium, solid solutions of rhenium, and alloys of rhenium.

As used herein, the term "base material" refers to the metal or alloy that forms the bulk of the binder phase of a substrate comprising hard particles dispersed and cemented in a binder. In this manner, various embodiments described in the present disclosure may comprise a substrate comprising a binder, wherein the binder comprises a base material and a near-surface PGM concentration gradient formed in the binder base material.

In various non-limiting embodiments, the base material of the binder may comprise, for example, cobalt, cobalt alloys, nickel, nickel alloys, iron, iron alloys, or combinations of any of these materials. For example, the base material of the binder may consist essentially of cobalt, nickel, or iron, respectively. Alternatively, the base material of the binder may be formed from a cobalt alloy, a nickel alloy, or an iron alloy. In embodiments comprising a base material formed from an alloy, the base material may include, for example, cobalt, nickel, iron, tungsten, chromium, titanium, tantalum, vanadium, molybdenum, niobium, zirconium, hafnium, carbon, copper, manganese, silver, aluminum, or combinations of any thereof.

In various non-limiting embodiments, the bulk composition of the binder may consist essentially of the base material. The near-surface composition of the binder may comprise a concentration gradient of at least one PGM diffused into the base material of the binder, characterized in that the maximum PGM concentration occurs in the binder at the substrate surface and decreases with depth below the surface. In various non-limiting embodiments, the PGM concentration gradient may decrease to a bulk PGM concentration at some point in the internal bulk composition of the binder that is less than the PGM concentrations forming the gradient. In various non-limiting embodiments, the PGM concentration gradient may decrease to no greater than incidental levels at some point in the internal bulk composition of the binder.

As used herein, the term "hard particles" refers to hard inorganic particles, which are cemented by the binder into a monolithic cemented hard particle material substrate. The hard particles may comprise, for example, metal carbides, metal nitrides, metal carbonitrides, metal borides, metal silicides, metal oxides, solid solutions of any of these materials, or combinations of any of these materials. The metal in these materials may be one or more elements from group IIIA and groups IVB through VIB of the periodic table. For example, the metal may be selected from titanium, chromium, vanadium, zirconium, hafnium, tantalum, molybdenum, niobium, tungsten, solid solutions of any of these metals, and combinations of any of these metals. The substrate of various embodiments according to the present disclosure may comprise the hard particles dispersed and cemented in the binder, characterized in that the binder comprises a near-surface PGM concentration gradient in at least a portion of the substrate.

In various non-limiting embodiments, the PGM forming the near-surface concentration gradient may comprise rhenium, ruthenium, osmium, rhodium, iridium, palladium, platinum, or combinations of any of these metals. The PGM may be diffused into the base material of the binder in at least a portion of the substrate. The base material of the binder may comprise cobalt, nickel, iron, alloys of any of these metals, and combinations of any of these metals and/or alloys. The PGM may be present in a decreasing concentration gradient comprising a maximum PGM concentration in the base material at the substrate surface and continuously or incrementally decreasing to incidental or bulk levels of PGM in the base material in the internal bulk portions of the substrate.

At least one coating may be present on at least a portion of the surface of the substrate according to the present disclosure. In various non-limiting embodiments, at least one coating may comprise a wear resistant coating. At least one coating may comprise, for example, a metal carbide, a metal nitride, a metal carbonitride, a metal boride, a metal silicide, a metal oxide, or a combination of any of these materials. The metal in these particular materials may comprise, for example, one or more elements from groups IIIA, IVA, and IVB through VIB of the periodic table. For example, the metal may comprise titanium, chromium, vanadium, zirconium, hafnium, tantalum, molybdenum, niobium, tungsten, aluminum, boron, silicon, solid solutions of any of these materials, or combinations of any of these materials. Those having ordinary skill will be aware of various coatings conventionally included on cutting tools to improve, for example, resistance to heat, wear, and/or shock, and any such coating may be included on cutting tools according to the present disclosure if it is compatible with the substrate.

Figure 1B:
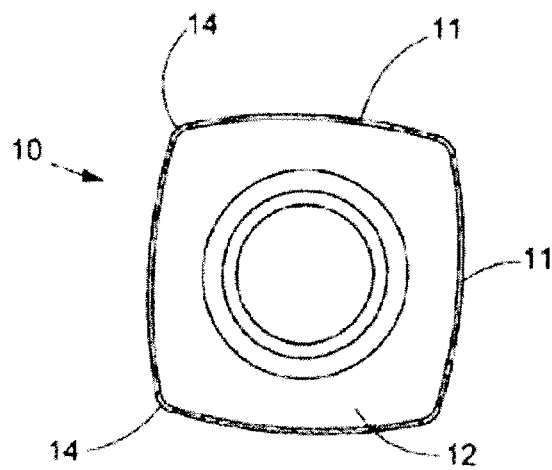
Figure 1C:
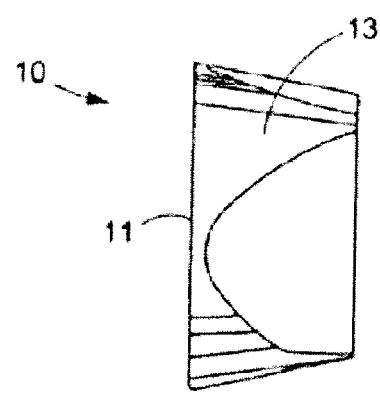

FIGS. 1A, 1B, and 1C illustrate a non-limiting embodiment of a cutting insert 10. FIG. 1A is a perspective view of the cutting insert 10. FIG. 1B is a top view of the cutting insert 10. FIG. 1C is a side view of the cutting insert 10. The cutting insert 10 may be described according to the ASTM/ISO Standard as XDLW120508SR-D. The ASTM/ISO Standard for describing cutting inserts is understood by those having ordinary skill in the cutting tool arts and, therefore, no further description of the geometry of the insert is necessary here. Embodiments of the cutting insert 10 include cutting edges 11, a top surface 12, side walls 13 and nose corners 14. Cutting insert 10 has a design typically used for heavy milling operations with high feed rates.

Figure 2A:
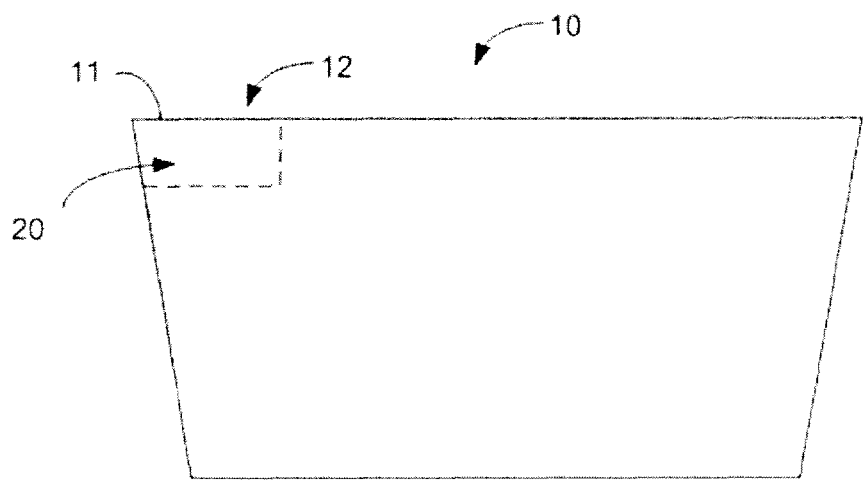
FIG. 2A is a cross-sectional view of the cutting insert illustrated in FIGS. 1A, 1B, and 1C.
Figure 2B:
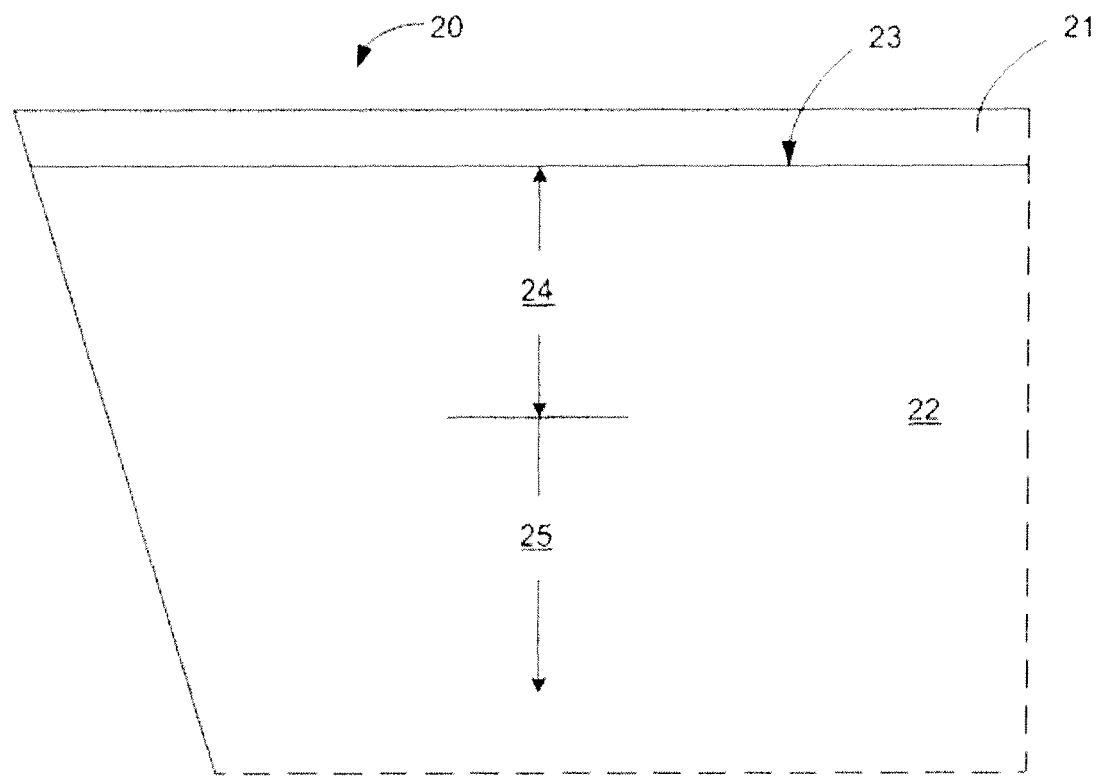
FIG. 2B is an expanded view of a portion of the cutting insert illustrated in FIG. 2A.

FIG. 2A is a cross-sectional view of the cutting insert 10 illustrated in FIGS. 1A, 1B, and 1C. FIG. 2A shows a portion 20 of cutting insert 10, which includes a portion of a cutting edge 11 and a portion of a top face 12. FIG. 2B is an expanded view of portion 20 of cutting insert 10 and is identified in FIG. 2A. As illustrated with reference to portion 20, cutting insert 10 comprises a coating 21 on a substrate 22. The coating 21 may comprise, for example, a metal carbide, a metal nitride, a metal carbonitride, a metal boride, a metal silicide, a metal oxide, or a combination or multi-layered arrangement of any of these materials. The metal in these materials may comprise, for example, aluminum, titanium, chromium, vanadium, zirconium, hafnium, tantalum, molybdenum, niobium, tungsten, boron, silicon, or combinations of any of these materials. The substrate 22 may be a cemented hard particle material comprising hard particles dispersed and cemented in a binder. For example, and without limitation, the hard particles may comprise metal carbides, metal nitrides, metal carbonitrides, metal borides, metal silicides, and/or metal oxides, and the binder may comprise cobalt, nickel, iron, and/or alloys of these metals.

The coating 21 and the substrate 22 are separated by interface 23. Interface 23 includes the surface of the substrate onto which coating 21 is deposited. The substrate 22 comprises a near-surface region 24 and a bulk region 25. The near-surface region may be defined by a depth into the substrate from the substrate surface/coating interface 23. The bulk region 25 may be defined by depths into the substrate beyond the near-surface region 24, measured in the same direction from the surface/coating interface 23.

Figure 2C:
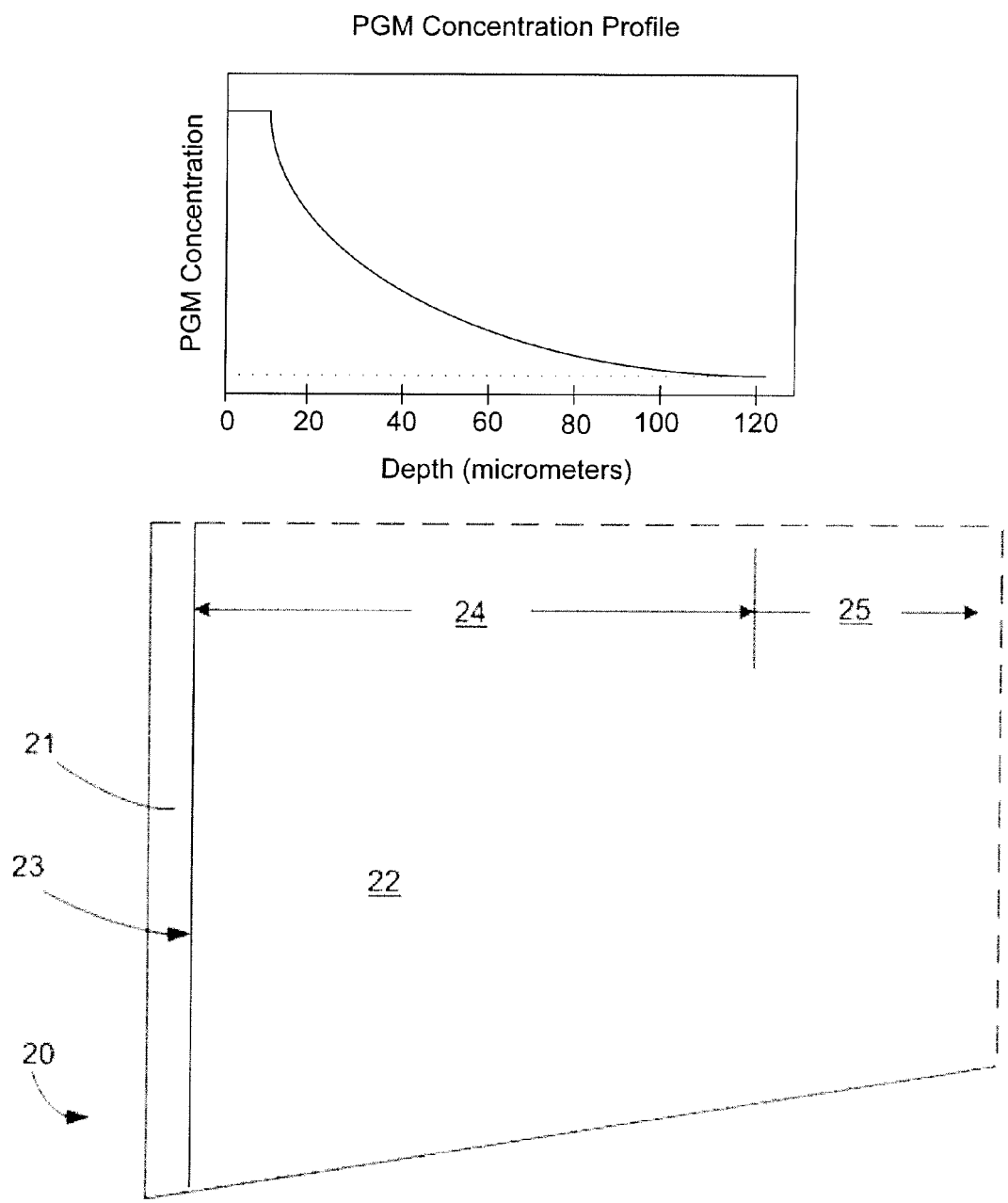
FIG. 2C is an alternative view of the portion of the cutting insert illustrated in FIG. 2B and also includes a superimposed graph illustrating a platinum group metal concentration gradient in a near-surface region of the cutting insert portion.

The binder in the near-surface region 24 may comprise a base material and a near-surface concentration gradient of at least one PGM, which may be introduced into the base material by a diffusion technique or any other suitable technique. The binder in the bulk region 25 may comprise base material and zero or background levels of PGM. As used herein, a "background" level or concentration of a material means a level that is incidental, comes about through impurities in the material, or that otherwise does not affect the properties of the material in a significant way. The composition of the binder in the near-surface region 24 may be characterized in that the maximum PGM concentration occurs in the binder at the substrate surface/coating interface 23 and decreases through the near-surface region 24 to background levels in the bulk region 25 (see, for example, FIG. 2C). Alternatively, the maximum PGM concentration occurs in the binder at the substrate surface/coating interface 23 and decreases through the near-surface region 24 to a bulk PGM concentration in the bulk region 25. A bulk PGM concentration in the bulk region is greater than background PGM levels, but less than the PGM concentrations forming the gradient in the near-surface region 24.

The composition of the binder in the near-surface region 24 may comprise a PGM selected from the group consisting of rhenium, ruthenium, osmium, rhodium, iridium, palladium, platinum, and combinations of any of these metals. The PGM may be dissolved in base material selected from the group consisting of cobalt, nickel, iron, alloys of any of these metals, and combinations of any of these metals and alloys. The composition of the binder in the bulk region 25 may be substantially free of PGM, i.e., the bulk binder composition may comprise zero or background levels of PGM. Alternatively, the composition of the binder in the bulk region 25 may comprise a bulk PGM concentration less than the PGM concentrations forming the gradient in the near-surface region 24.

In various non-limiting embodiments of the cutting tools described in the present disclosure, the substrate may be formed using powder metallurgy techniques. For example, a metallurgical powder mixture comprising hard particles and binder metal powder may be consolidated to form a compact in the general shape of a cutting tool or other article using techniques known in the art. The binder metal powder may include, for example, powder forms of cobalt, nickel, and/or iron. The binder metal powder may also include, for example, powder forms of tungsten, chromium, titanium, tantalum, vanadium, molybdenum, niobium, zirconium, hafnium, and carbon. The various elements may be present up to their solubility limits in the base material of the binder (e.g., cobalt, nickel, iron, alloys thereof, or combinations thereof) so that a single phase binder is formed during subsequent sintering. Additionally, the binder metal powder may contain copper, manganese, silver, and aluminum, for example, at levels up to 5 weight percent based on the total weight of the sintered, single phase binder. A person having ordinary skill in the art will recognize that any or all of the constituents of the cemented hard particle substrate may be introduced in elemental form, as compounds, and/or as master alloys.

In various non-limiting embodiments, during the mixing, consolidation, and sintering stages, no significant level of PGM is intentionally added to the metallurgical powder or the compact. In various other non-limiting embodiments, PGM may be intentionally added to the metallurgical powder forming the compact. In this manner, a bulk PGM concentration may be formed in the binder, provided, however, that the bulk PGM concentration is sufficiently low to allow the subsequent formation of a near-surface PGM concentration gradient through diffusion or other suitable mechanism (described below).

The compact may be sintered to form a finished part or a blank having a solid monolithic construction using techniques known in the art. In this manner, the part or blank comprises a cemented hard particle substrate. The substrate may comprise, for example, from 70 percent to 97 percent hard particles and from 3 percent to 30 percent binder by weight based on the total weight of the substrate. After sintering, a blank may be machined to form at least one cutting edge and/or other features of the particular geometry desired on the cutting tool. At this stage, the substrate comprises hard particles dispersed and cemented in a continuous phase of binder, wherein the binder comprises, for example, cobalt, nickel, iron, alloys of these metals, or combinations of these metals and alloys. In various embodiments, the sintered substrate does not comprise any intentional addition of a significant level of PGM, and any PGM present in the substrate at this point is present only in background levels. In various other embodiments, the sintered substrate comprises a bulk concentration of PGM that would not prevent the subsequent formation of a near-surface PGM concentration gradient.

A near-surface PGM concentration gradient may be formed by depositing a layer comprising at least one PGM on at least a portion of at least one surface of the sintered substrate. The layer comprising at least one PGM may be applied on a portion of a surface of the substrate, an entire surface of the substrate, or all surfaces of the substrate. For example, the layer may be applied to any one or more of a rake face, a flank face, cutting edges, and/or other surfaces/edges of a cutting tool substrate.

In various non-limiting embodiments, the thickness of a deposited PGM layer may depend on the method used for application of the layer. For example, a physical vapor deposition (PVD) process, which may be directional in nature, may be used to deposit a PGM layer. In various embodiments, a PGM layer applied by a PVD process may have a thickness of 2 to 25 microns, and in some embodiments, 2 to 10 microns. A PGM layer deposited by non-directional methods, such as, for example, electroplating and electroforming, may have a PGM layer thickness of up to 250 microns. PGM dispersed in water or a volatile carrier and applied by spraying or brush painting may have a PGM layer thickness of 250 microns to 765 microns (approximately 0.010 inches to 0.030 inches) depending on the PGM coating density and method used. By utilizing various methods, in this manner, the PGM(s) may be selectively deposited on only predetermined surfaces of the substrate, such as, for example, cutting edges, flank faces, rake faces, and/or other surfaces of cutting tools prone to wear and/or failure. This may reduce the amount of PGM needed to improve tool performance because the surface property modification may be targeted to particular regions of cemented cutting tools. In various embodiments, lithography or other suitable masking techniques, for example, could be used to restrict deposition of the layer to only certain regions of the surface of the substrate.

After a layer of at least one PGM is deposited on a cemented hard particle substrate, a heat treatment step may be used to diffuse the applied PGM into the substrate. The time and temperature of the heat treatment cycle may be important because the concentration gradient and the depth of diffusion resulting from diffusing PGM is directly dependent on these parameters, and because the resulting performance improvement of the cutting tool is dependent on the gradient and the depth of diffusion. The diffusion of a PGM or a combination of PGMs in cobalt, for example, is relatively fast at normal sintering temperatures (~1400° C.). If the diffusion of the PGM into the binder base material is too rapid, then the concentration gradient may not form properly. Therefore, in various embodiments, a substrate having PGM deposited thereon may be treated at a temperature less than 1400° C. In various embodiments, a substrate having PGM deposited thereon may be treated at a temperature ranging from 1325° C. to 1375° C. In other embodiments, a substrate having PGM deposited thereon may be treated at a temperature of 1325° C. or less. In various embodiments, a substrate having PGM deposited thereon may be treated at a temperature of 1325° C. for a period of 60 minutes at temperature to obtain the desired near-surface concentration gradient by diffusion of PGM into the binder base material.

In various embodiments, a PGM deposition step and a subsequent heat treatment step may be repeated one or more times. Repeating PGM deposition and heat treatment may extend the depth of a near-surface PGM concentration gradient, which may not otherwise be possible due to the relatively fast diffusion of PGMs in binder base materials such as cobalt. In this manner, various sequential deposition and heat treatment cycles may be employed to form various near-surface PGM concentration gradients.

In various embodiments, after sintering a compact but before depositing a layer comprising at least one PGM, a portion of the binder may be removed from at least a portion of a surface of the substrate. For example, a surface of the substrate may be etched to remove a portion of the binder from at least a portion of the surface of the substrate before depositing PGM onto that portion of the surface. An etching operation may leach the binder from the cemented matrix, thereby exposing hard particle grains at the substrate surface. In various embodiments, the binder may be etched to a depth of 2 to 100 microns. In other embodiments, the binder may be etched to a depth of 2 to 25 microns. The depth of the etched binder may be controlled by controlling the chemical strength and temperature of the etchant and the time of contact between the etchant and the substrate.

Removing binder from the surface of the substrate before depositing PGM may improve the performance of the cutting tool by improving the concentration gradient of the PGM in the binder base material in the cemented hard particle matrix. For example, this process may allow the deposited layer comprising PGM(s) to initially enter into the cemented hard particle matrix by wetting of the exposed hard particle grains and capillary action along the surfaces of the hard particles. In the initial stages of the diffusion process, competing substitutional diffusion (e.g., PGM diffusing into base material and base material co-diffusing into a deposited PGM layer) may be reduced by the gap between the deposited PGM layer and the binder base material. As the diffusion process continues and the gap is filled with diffusing material, the binder base material may diffuse back into the etched volume and begin to alloy with the diffused PGM(s).

A binder etching operation may also be used to create a surface region devoid of the binder base material, and instead, comprising hard particles at least partially cemented in the deposited layer comprising PGM(s). In various embodiments, the concentration gradient may begin at the substrate surface with essentially 100% PGM and gradually become diluted with the binder base material into the bulk region of the substrate. The bulk region of the substrate may comprise essentially 100% binder base material. In this manner, the concentration gradient may comprise a surface binder composition consisting essentially of PGM and decreasing to a bulk binder composition consisting essentially of base material. In various embodiments, the concentration gradient may comprise a surface binder composition consisting essentially of PGM and decreasing to a bulk binder composition comprising base material and PGM present at a concentration that is less than the PGM concentrations forming the gradient.

Binder compositions at the substrate surface comprising up to essentially 100% PGM may be achieved due to the wetting of the exposed hard particle grains by the PGM prior to the start of co-diffusion of the PGM and base material. The resulting gradient may extend into the substrate from the surface until the PGM content is undetectable and only the binder base material is present in the bulk region of the substrate. Alternatively, the resulting gradient may extend into the substrate from the surface until the PGM content is at a bulk concentration in the bulk region of the substrate.

Accordingly, the particular processing steps employed to form a substrate comprising hard particles and a binder, the binder comprising a near-surface platinum group metal concentration gradient, may directly affect the chemistry and/or structure of the substrate.

In various embodiments, it may be critical that enough of the binder base material is removed from the substrate surface to allow for initial wetting of the hard particle grains without immediate co-diffusion of the PGM and base material. However, it may also be critical to prevent the removal of too much binder because a concentration gradient may not form if the open volume between a deposited layer comprising PGM(s) and the underlying binder is too large. In various embodiments comprising tungsten carbide hard particles cemented in a cobalt binder, etching the cobalt binder to a depth of 2 to 100 micrometers may allow for the formation of an optimal PGM concentration gradient. In various embodiments comprising tungsten carbide hard particles cemented in a cobalt binder, etching the cobalt binder to a depth of 2 to 25 micrometers may allow for the formation of an optimal PGM concentration gradient.

Cemented WC—Co substrates containing TiC, TaC, and/or NbC may require different heat treatment cycles (e.g., increased temperatures and longer exposure times) to form a suitable PGM concentration gradient. This is believed to be due to the differences in substitutional diffusion parameters in the binder base material resulting from the presence of Ti, Ta, and Nb.

Many types of chemical etchants may find utility in embodiments of methods according to the present disclosure in which a portion of the binder is etched before depositing the layer including the PGM. An example of one suitable and effective etchant for removing cobalt from a sintered substrate comprising tungsten carbide particles dispersed and cemented in cobalt binder comprises an aqueous solution of 5% by volume of phosphoric acid (85%) and 1% by volume of hydrogen peroxide (30%). Contact between the substrate and this solution for a period of five (5) minutes will remove the cobalt binder to a depth of approximately 10 micrometers, measured from the substrate surface. Extended times will allow the leaching process to penetrate further into the WC—Co substrate in an approximately linear manner for times less than 60 minutes.

For cutting tools (such as, for example, burrs, endmills, drills, and inserts) that require very sharp edges, the deposition and diffusion of the PGM(s) after partial removal of binder base material from the cemented substrate surface may reduce undesirable grain growth and edge rounding that may otherwise occur if the PGM is deposited onto the substrate surface without having first removed some amount of binder. However, a near-surface PGM concentration gradient may still be produced according to the disclosed embodiments without prior binder removal from a cemented substrate.

In various embodiments, the specific near-surface PGM concentration gradient may be critical to the effective production of tools that achieve enhanced performance levels. Because differences in surface conditions and chemical composition may alter the rate of substitutional diffusion, it may be important to measure the concentration gradient in terms of the specific heat treatment processing cycle used to form the gradient. Accordingly, a depth-dependent concentration profiling technique, such as, for example, glow discharge optical emission spectroscopy (GD-OES), may be used to measure chemical composition as a function of depth from the substrate surface. In this manner, the near-surface PGM concentration gradient of a cemented hard particle substrate may be characterized for various combinations of hard particle, binder base material, PGM(s), binder removal operations, and heat treatments, for example.

Figure 3:
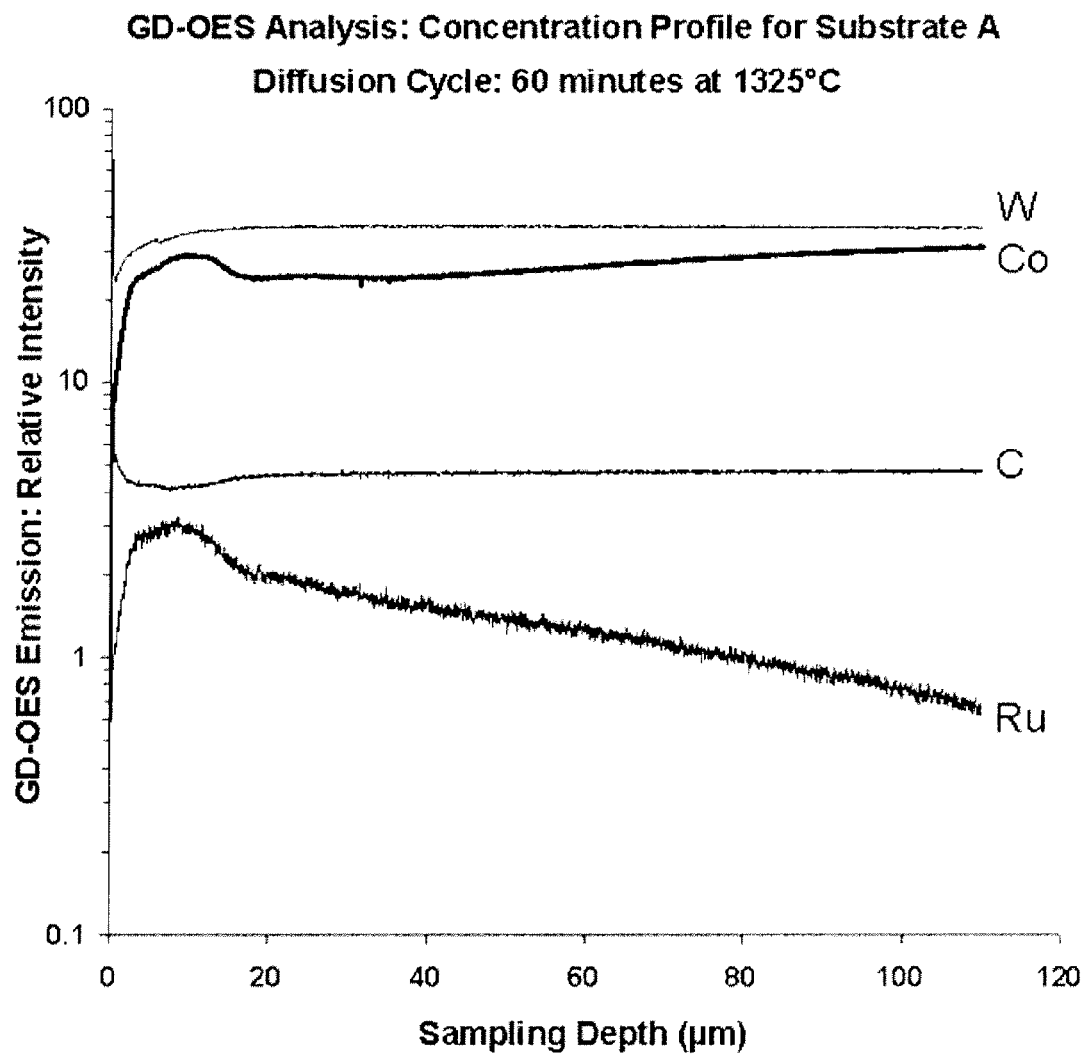
FIG. 3 is a semi-log plot of glow discharge-optical emission spectroscopy (GD-OES) emission (relative intensity values for tungsten, cobalt, carbon, and ruthenium) as a function of depth from the surface of a WC-11Co substrate (11 weight percent cobalt binder base material and 87-89 weight percent tungsten carbide particles, allowing for small additions of TiC/TaC/NbC), wherein the substrate was coated with a 4 micrometer layer of ruthenium and processed by a 1325° C. and 60 minute heat treatment cycle to form the near-surface ruthenium concentration gradient shown in the plot as a result of a diffusion cycle.

Using GD-OES, for example, in certain non-limiting embodiments according to the present disclosure, a PGM concentration gradient suitable for improving wear resistance was determined to comprise a maximum of about 2 weight percent ruthenium at the surface of a WC-11Co substrate (11 weight percent cobalt binder and 87-89 weight percent tungsten carbide particles, allowing for small additions of TiC/TaC/NbC). The 2 weight percent concentration of ruthenium was based on the total weight of the substrate at the surface (total weight of the ruthenium, cobalt, and carbide particles). As shown in FIG. 3, the ruthenium concentration gradient of a treated WC-11Co substrate logarithmically decreased from 2 weight percent to background levels within about 125 micrometers from the substrate surface. The gradient corresponded to approximately 20 weight percent ruthenium on a total binder weight basis at the substrate surface (i.e., total weight of ruthenium and cobalt base material at the substrate surface). This gradient was formed by applying a 4 micrometer thick layer of ruthenium using a PVD process and heat treating the substrate at 1325° C. for 60 minutes to diffuse the PGM into the near-surface region of the binder in the substrate.

In various embodiments, the binder at the substrate surface may comprise from 5 percent to 100 percent PGM, and from zero percent to 95 percent base material, by weight on a total binder weight basis (i.e., total weight of PGM and base material). In various embodiments, the binder at the substrate surface may comprise from 10 percent to 100 percent PGM, and from zero percent to 90 percent base material, by weight on a total binder weight basis. In various embodiments, the binder at the substrate surface may comprise from 20 percent to 100 percent PGM, and from zero percent to 80 percent base material, by weight on a total binder weight basis.

In various embodiments, the binder in the bulk region of the substrate may comprise from zero percent to 60 percent PGM, and from 40 percent to 100 percent base material, by weight on a total binder weight basis. In embodiments where the binder in the bulk region comprises from zero percent to 60 percent PGM, the binder may be initially formed using two or more metallurgical powders, such as, for example, a cobalt powder and a PGM powder. The two or more metallurgical powders may be mixed and processed as described herein to form a bulk binder material comprising PGM. A near-surface PGM concentration gradient may then be formed as described herein, wherein the PGM in the bulk binder material and the PGM forming the near-surface concentration gradient are the same PGM or different PGM. In embodiments where two or more metallurgical powders are used to form a bulk binder material, the binder in the bulk region of a substrate and the binder in the near surface region of a substrate may both comprise the same or different PGM, provided that the PGM in the near surface region forms a PGM concentration gradient.

In various embodiments, after the heat treatment to form the near-surface PGM concentration gradient, a coating may be deposited onto the substrate surface. The coating may comprise a wear resistant coating. The coating may comprise one layer or multiple layers, characterized in that the layers may comprise the same or different compositions. In various embodiments, the coating may comprise, for example, at least one of a metal carbide, a metal nitride, a metal carbonitride, a metal boride, a metal silicide, a metal oxide, or combinations of any of these materials. The metal may be selected from the group consisting of aluminum, titanium, chromium, vanadium, zirconium, hafnium, tantalum, molybdenum, niobium, tungsten, boron, silicon, solid solutions of any of these materials, and combinations of any of these materials.

For example, the coating may comprise at least one of titanium carbide (TiC), titanium nitride (TiN), titanium carbonitride (TiCN), titanium aluminum nitride (TiAlN), titanium aluminum nitride plus carbon (TiAlN+C), titanium aluminum nitride plus tungsten carbide/carbon (TiAlN+WC/C), aluminum titanium nitride (AlTiN), aluminum titanium nitride plus carbon (AlTiN+C), aluminum titanium nitride plus tungsten carbide/carbon (AlTiN+WC/C), aluminum oxide ($Al_2O_3$), titanium diboride ($TiB_2$), tungsten carbide carbon (WC/C), chromium nitride (CrN), aluminum chromium nitride (AlCrN), zirconium nitride (ZrN), zirconium carbon nitride (ZrCN), boron nitride (BN), boron carbon nitride (BCN) hafnium nitride (HfN), or hafnium carbon nitride (HfCN).

In various embodiments, the coating may be applied by a PVD process. Examples of PVD processes that may find utility in the disclosed processes include, for example, evaporation processes, activated reactive evaporation, arc discharge evaporation, laser ablation, ion plating, sputtering, and ion beam assisted deposition. Certain PVD coatings applied on substrates comprising hard particles dispersed and cemented in a binder having a near-surface PGM concentration gradient according to the present disclosure may be characterized as thin, hard, homogeneously smooth, chemically stable and having a highly dense structure.

In various other embodiments, the coating may be applied by a chemical vapor deposition (CVD) process. Examples of CVD processes that may find utility in the disclosed processes include, for example, thermal CVD and plasma-assisted CVD.

Cutting tools according to the present disclosure may comprise substrates comprising hard particles cemented in a binder including a near-surface PGM concentration gradient. The disclosed cutting tools may also comprise CVD and/or PVD coatings on the substrates. The disclosed cutting tools may exhibit enhanced hardness, reduced friction, chemical stability, enhanced wear resistance, enhanced thermal crack resistance, and prolonged tool life.

PVD coatings and CVD coatings may be respectively characterized by certain unique differences in the microstructure and residual stresses of coatings deposited by the respective processes. For example, PVD coatings typically have fine grains and high residual compressive stresses which tend to improve the hardness and toughness of a cutting tool comprising a PVD coating. Accordingly, PVD coatings may offer certain performance advantages over CVD coatings when applied to cutting tools.

A cemented hard particle substrate including cobalt as a binder may exhibit a tendency for cobalt to melt and penetrate through the surface of a compact during the sintering process, thereby forming cobalt structures on the surface of a sintered substrate. This phenomenon may be referred to as cobalt capping. Cobalt caps on a substrate surface may be randomly distributed, thus creating a crested and rough texture on the surface of the substrate. The presence of PGM in the cobalt binder at the surface of a substrate may increase the height and frequency of the cobalt caps. Although some surface treatment techniques may be performed to reduce the cobalt capping effect to some degree, it may be difficult to consistently produce a uniform surface on a sintered cemented hard particle substrate containing PGM in a cobalt binder. Accordingly, in embodiments where a coating is applied using PVD and/or CVD processes, the substrate surface may be subjected to a pre-coating surface treatment.

The pre-coating surface treatment may comprise at least one operation, such as, for example, electropolishing (e.g., U.S. Pat. No. 5,665,431, incorporated by reference herein), shot peening, microblasting, dry blasting, wet blasting (e.g., U.S. Pat. Nos. 5,635,247 and 5,863,640, incorporated by reference herein), grinding (e.g., U.S. Pat. No. 6,217,992, incorporated by reference herein), brushing (e.g., U.S. Pat. No. 5,863,640, incorporated by reference herein), jet abrading, or compressed air blasting. A pre-coating surface treatment may reduce the surface irregularities due to cobalt capping effects on the cemented substrate surfaces, which may enhance the adhesion of CVD and/or PVD coatings applied to cemented substrate surfaces.

In various non-limiting embodiments, the coating may be from 1 to 30 micrometers thick. In various non-limiting embodiments, the coating may be from 1 to 30 micrometers thick. In other non-limiting embodiments, the coating may be greater than 10 to 30 micrometers thick. In various other non-limiting embodiments, the coating may be from 2 to 6 micrometers thick or from 3 to 5 micrometers thick.

In various non-limiting embodiments, the coating may comprise a 1 to 10 micrometers thick TiAlN layer deposited by a PVD operation. In other non-limiting embodiments, the coating may comprise a 1 to 10 micrometers thick TiN—TiC—TiN three-layer coating deposited by successive chemical vapor deposition (CVD) operations. In various other non-limiting embodiments, the coating may comprise at least one layer deposited using a PVD operation and at least one layer deposited using a CVD operation.

When a CVD and/or PVD coating is applied according to the processes disclosed herein, the presence of a metal layer on top of the cemented substrate may cause performance problems. The problems may result from the softening of the metal layer beneath the relatively hard, wear resistant coating. Because a metal layer does not contain a matrix of hard particle grains, the metal layer may not be effectively anchored to the underlying cemented substrate. When such a relatively soft metal layer underlying a relatively hard coating layer softens due to the heat generated during machining, the hard coating layer may be sheared away due to the frictional forces of a chip against the rake face of the tool. If the hard coating layer shears away, the underlying substrate is no longer protected and excessive cratering and catastrophic tool failure may occur. A pre-coating surface treatment that removes any metal layer from the substrate surface may reduce the occurrence of coating failure.

The mechanical removal of a metal layer may be achieved, for example, by dry or wet blasting with an appropriate blasting media such as $Al_2O_3$. Chemical removal of a metal layer may also be possible; however, due to the increased corrosion resistance of the binder due to the presence of the near-surface PGM(s), chemical removal may be more difficult to perform and more difficult to control than mechanical removal.

In various embodiments, the coating may be subjected to a post-coating surface treatment. A post-coating surface treatment may further improve the surface quality of the coating.

There are a number of methods for post treatment of a coated cutting tool surface, such as, for example, shot peening. Japanese Patent No. 02254144, incorporated by reference herein, describes a shot peening process using injection of small metal particles having a spherical grain shape with grain size in a range of 10-2000 micrometers. Another example of post-coating surface treatment is compressed-air blasting. U.S. Pat. No. 6,869,334, incorporated by reference herein, describes a blasting process using an inorganic blasting agent, such as $Al_2O_3$, having a very fine grain size ranging from 1 to 100 micrometers. Another example of post-coating surface treatment is brushing. U.S. Pat. No. 6,638,609, incorporated by reference herein, describes a brushing process using a nylon straw brush containing SiC grains. Wet blasting may also be used as a post-coating surface treatment to create a smooth coating layer as described in U.S. Pat. No. 6,638,609.

The disclosed processes may be used to produce cutting tools comprising a wear resistant coating on a substrate comprising hard particles and a binder, characterized in that the near-surface composition of the binder comprises a PGM concentration gradient. The disclosed processes eliminate or reduce the need to include PGM(s) in the consolidation and sintering stages of the production of cutting tools using powder metallurgy techniques. By eliminating or reducing the addition of PGM(s) in a powder metallurgy process, significant yield losses and the resulting costs are reduced or eliminated. Because PGM(s) are relatively expensive materials, the disclosed processes may facilitate a significant cost savings in producing cutting tools containing PGM(s). In addition, because the disclosed processes allow for the selective and targeted addition of PGM(s) to particular portions of cutting tools rather than the bulk addition of PGM(s) during the consolidation or sintering stages, the disclosed processes may result in significant improvement of the overall performance of PGM-containing cutting tools.

The disclosed cutting tools may exhibit reduced wear, for example, reduced flank wear, on the cutting tools during machining operations. This may result in extended tool life. In addition, the disclosed cutting tools may exhibit increased metal removal rates by allowing for increases in machining speed, feed rate, and/or depth of cut without sacrificing tool life. The ability to increase the amount of material removed in a given period of time may have a significant impact on the financial success of a commercial machining venture or operation. Increased metal removal rate (MRR) may be particularly important when machining difficult-to-machine materials such as titanium, titanium alloys, nickel, nickel alloys, superalloys, stainless steels, and ductile iron.

For example, titanium alloys tend to have relatively low thermal conductivities. The thermal properties of titanium alloys require machining operations to be performed at slow speeds due to the tendency for excessive heat generation and subsequent tool failure. The disclosed cutting tools may improve the profitability of machining titanium alloys, for example, by increasing the amount of material removed in a given time while also reducing the tooling cost. This may be achieved through higher MRRs and longer tool life for titanium machining applications, for example.

The near-surface PGM concentration gradient increases the usefulness and applicability of the disclosed cutting tools by improving solid solution strengthening, hardness, fracture toughness, thermal resistance, and wear resistance. The high melting temperatures of many PGMs and related alloys improve the high-temperature properties of cemented substrates, such as, for example, hot hardness, which allow for very high operating temperatures at the cutting edge of a tool without immediate deformation and subsequent failure. In addition, the near-surface PGM concentration gradient improves the substrate properties by achieving higher concentrations of PGM at the cutting edge, which in turn improves the foundation for wear resistant coatings applied, for example, by CVD, PVD, or other methods. The strengthening of the substrate due to diffusion and subsequent solid solution strengthening increases the thermal deformation resistance and the fracture toughness of the substrate. These improved properties create a better platform for a wear resistant coating. As a result, higher MRRs may be achieved for the same or longer tool life. Accordingly, the benefits of a near-surface PGM concentration gradient combined with a wear resistant coating complement one another to provide substantially improved cutting tools.

The illustrative and non-limiting examples that follow are intended to further describe the embodiments presented herein without restricting their scope. Persons having ordinary skill in the art will appreciate that variations of the Examples are possible within the scope of the invention as defined solely by the claims. All parts and percents are by weight unless otherwise indicated.

EXAMPLES

Example 1

Coated cutting inserts according to various embodiments disclosed herein were prepared. The cutting inserts comprised substrates prepared using powder metallurgy techniques and having the nominal chemical compositions and select properties presented below in Table 2. The substrates comprised tungsten carbide hard particles dispersed and cemented in a cobalt binder. Certain substrates also comprised small concentrations of carbides of titanium, tantalum, and niobium. Certain substrates also comprised ruthenium in the bulk binder composition.

Metallurgical powders in the weight percentages shown in Table 2 were mixed. Each metallurgical powder (A-Z) was wet blended in a ball mill.

TABLE 2

| Chemical Composition | | | | | Properties | |
|---|---|---|---|---|---|---|
| (weight percent rounded to nearest 1%) | | | | | Density | Hardness |
| Substrate | WC | Co | Ru | TiC/TaC/NbC | (g/cm$^3$) | (HRA) |
| A | 88 | 11 | 0 | <2 | 14.3 | 90 |
| B | 88 | 11 | 0 | <2 | 14.3 | 90 |
| C | 88 | 9 | 0 | <2 | 14.5 | 90 |
| D | 89 | 11 | 0 | <1 | 14.4 | 90 |
| F | 91 | 9.5 | <2 | <1 | 14.6 | 90 |
| G | 89 | 9 | 0 | <2 | 14.5 | 90 |
| H | 82 | 7 | 0 | 10-15 | 12.8 | 92 |
| I | 86 | 7 | 0 | 7-10 | 13.8 | 91 |
| J | 86 | 7 | 0 | 7-10 | 13.8 | 91 |
| K | 87 | 6 | 0 | 7-10 | 13.8 | 91 |
| L | 84 | 8 | 0 | 7-10 | 13.6 | 90 |
| M | 84 | 8 | 0 | 7-10 | 13.6 | 90 |
| N | 67 | 12 | <2 | 15-20 | 11.7 | 91 |
| Z | 96 | 4 | 0 | <1 | 15.2 | 92 |
| 1 | 94 | 6 | 0 | <1 | 14.9 | 92 |
| 2 | 96 | 4 | 0 | 0 | 15.2 | 92 |
| 3 | 94 | 6 | 0 | <1 | 14.9 | 92 |
| 4 | 94 | 6 | 0 | 0 | 14.9 | 93 |

After drying, the mixed and blended compositions were compressed into green sized bodies of the designated cutting insert under a pressure of 10 tons/in$^2$ (140 MPa). Next, the compacted green bodies of the tungsten carbide cutting inserts were vacuum sintered in a furnace to close the pores in the green bodies and build up the bond between the hard particles to increase the strength and hardness. The vacuum sintering process included a dewaxing cycle, a presintering cycle, and a high temperature sintering cycle.

The sintering procedure was performed using the following parameters during the major processing steps:

(i) the dewaxing cycle started at room temperature with a ramping speed of 2° C./minute until reaching a temperature of 375° C. and then held at this temperature for approximately 90 minutes;

(ii) the presintering cycle, which breaks down the oxides of Co, W, C, Ti, Ta, Nb, etc., started with a ramping speed of 4° C./minute until reaching a temperature of 1,200° C. and then held at this temperature for 60 minutes;

(iii) the high temperature sintering cycle started with a temperature ramp from 1,200° C. to 1,400° C./1,450° C. (i.e. the sintering temperature), and ended after a hold of approximately 120 minutes at the sintering temperature, during which the sintered substrates became non-porous and reduced to the desired sintered size; and (iv) a cooling cycle was performed to let the sintered cemented carbide cutting insert substrates cool down to room temperature while inside the furnace.

Following the sintering process, a layer of a PGM was deposited onto the cutting edge surfaces of the insert substrates using a PVD process. A 4-micrometer PVD coating of ruthenium was deposited onto each of the inserts comprising each cemented carbide substrate. In addition, inserts comprising substrate A and having an ADKT1505PDER-47 geometry were painted with a layer of either ruthenium, rhenium, iridium, osmium, or platinum. Each cutting insert substrate was processed according to a 1325° C., 60 minute heat treatment cycle to diffuse the PGM into the binder phase of the substrate and produce a logarithmic near-surface PGM concentration gradient.

Next, the cemented tungsten carbide cutting inserts were dry blasted with alumina grit, ground, and edge-honed to complete the formation of the particular insert geometry. Table 3 presents the particular insert geometries (ASTM/ISO standard designation) prepared for each substrate presented in Table 2.

TABLE 3

| Insert Geometry | Substrate |
|---|---|
| ADKT1505PDER-47 | A |
| APKT1604PDER-43 | B |
| XDLT120408ER-D41 | C |
| XDLT120408ER-D41 | D |
| CNMG432-4T | F-N |
| CNMG432-4E | 1-4 |
| RCMR96S-4M | Z |

FIG. 3 is a semi-log plot of GD-OES emission (relative intensity values for tungsten, cobalt, carbon, and ruthenium) as a function of depth from the surface of a sample of substrate A that was coated with a 4-micrometer layer of ruthenium and processed according to a 1325° C., 60 minute heat treatment cycle to form the near-surface ruthenium concentration gradient shown in the graph. As indicated by the graph, the concentration of tungsten and carbon is relatively constant through the sampling depth, which indicates a homogeneous distribution of tungsten carbide particles throughout the substrate. The slight increase in cobalt concentration and the decrease in ruthenium concentration with increasing depth into the near-surface region of the substrate indicate that co-diffusion processes established the ruthenium concentration gradient. The ruthenium concentration is at a maximum of approximately 2 percent at the substrate surface and decreases logarithmically to background levels (approximately 0.1 percent) within approximately 125 micrometers from the substrate surface on a total substrate weight basis (corresponding to approximately 20 percent ruthenium at the substrate surface on a total binder weight basis).

Next, the cutting insert substrates (with and without near-surface PGM concentration gradients) were coated with a wear resistant coating. Table 4 presents the particular coating applied to the cutting inserts for each geometry/substrate combination presented in Table 3.

TABLE 4

| Insert Geometry | Substrate | Coating |
|---|---|---|
| ADKT1505PDER-47 | A | TiN—TiC—TiN (CVD) |
| APKT1604PDER-43 | B | TiN—TiC—TiN (CVD) |
| XDLT120408ER-D41 | C | TiN—TiC—TiN (CVD) |
| XDLT120408ER-D41 | D | TiN—TiC—TiN (CVD) |
| CNMG432-4T | F-N | TiN—TiCN—Al$_2$O$_3$—TiN (CVD) |
| CNMG432-4E | 1-4 | TiAlN (PVD) |
| RCMR96S-4M | Z | TiN—TiCN-αAl$_2$O$_3$—TiCN—TiN (CVD) |

Examples 2-8 present performance tests of cutting inserts produced as described above. The experimental results include analysis of the effects of wear at the cutting edge of the cutting insert and are shown in FIGS. 4 to 10. The total machining time shown in the figures indicates when a cutting insert either exceeds the tool life or is destroyed during the machining process. Example 9 also presents a performance test of cutting inserts produced as described above. However, the experimental results include analysis of tool lifetime and are shown in FIG. 11. Table 5 summarizes the workpiece materials and cutting conditions used in each of the Examples that follow.

TABLE 5

| Example | Insert | Substrate | Coating | Workpiece | Cutting Parameters: (Cutting Speed [m/min], Feed Rate [mm/tr,rev], Depth of Cut [mm]) |
|---|---|---|---|---|---|
| 2 | ADKT1505PDER-47 | A | TiN—TiC—TiN (CVD) | Ti—6Al—4V (300 HBN) | 55 m/min 0.1 mm/tr 3 mm |
| 3 | APKT1604PDER-43 | B | TiN—TiC—TiN (CVD) | Ti—6Al—4V (300 HBN) | 60 m/min 0.1 mm/tr 3 mm |

TABLE 5-continued

| Example | Insert | Substrate | Coating | Workpiece | Cutting Parameters: (Cutting Speed [m/min], Feed Rate [mm/tr,rev], Depth of Cut [mm]) |
|---|---|---|---|---|---|
| 4 | XDLT120408ER-D41 | C | TiN—TiC—TiN (CVD) | Ti—6Al—4V (320 HBN) | 70 m/min 0.3 mm/tr 1 mm |
| 5 | XDLT120408ER-D41 | D | TiN—TiC—TiN (CVD) | Ti—6Al—4V (320 HBN) | 70 m/min 0.3 mm/tr 1 mm |
| 6 | CNMG432-4T | F-N | TiN—TiCN—Al$_2$O$_3$—TiN (CVD) | 4340 steel (300 HBN) | 244 m/min 0.25 mm/rev 1.5 mm |
| 7 | CNMG432-4E | 1-4 | TiAlN (PVD) | Ti—6Al—4V (320 HBN) | 76 m/min 0.2 mm/rev 1.5 mm |
| 8 | RCMR96S-4M | Z | TiN—TiCN—αAl$_2$O$_3$—TiCN—TiN (CVD) | 1036 steel (forged, 350 HBN) | 86 m/min 1.5 mm/rev ~5.0 mm |
| 9 | ADKT1505PDER-47 | A | TiN—TiC—TiN (CVD) | Ti—6Al—4V (300 HBN) | 55 m/min 0.1 mm/tr 3 mm |

Example 2

Three (3) different groups of TiN—TiC—TiN CVD coated milling inserts, each having a standard geometry designation ADKT1505PDER-47, were used for tool wear testing involving milling a Ti-6Al-4V workpiece. The milling conditions are shown in Table 5. The three (3) groups of ADKT1505PDER-47 milling inserts used to perform the tool wear testing each respectively comprised: (i) a GX20™ substrate (ATI Stellram, an Allegheny Technologies Company, LaVergne, Tenn., 37086, USA); (ii) Substrate A without a near-surface ruthenium concentration gradient; and (iii) Substrate A with a near-surface ruthenium concentration gradient as described above.

Substrate A was produced from a tough grade cemented carbide powder that may be used to machine P45/K35 materials according to ISO standards. The nominal chemical composition and certain properties of Substrate A are shown in Table 2. GX20™ powder, which is available from ATI Stellram, is a cemented carbide powder having the nominal chemical composition and certain properties presented in Table 6.

TABLE 6

| Chemical Composition (weight percent rounded to nearest 1%) | | | Properties | |
|---|---|---|---|---|
| WC | Co | Ru | Density (g/cm$^3$) | Hardness (HRA) |
| 89 | 10 | <2 | 14.6 | 90 |

The coated GX20™ cemented carbide milling inserts were prepared using powder metallurgy techniques similar to those described above in Example 1. The GX20™ milling inserts were used to provide baseline wear properties for comparison with the wear properties of Substrate A milling inserts (with and without Ru gradient).

Figure 4:
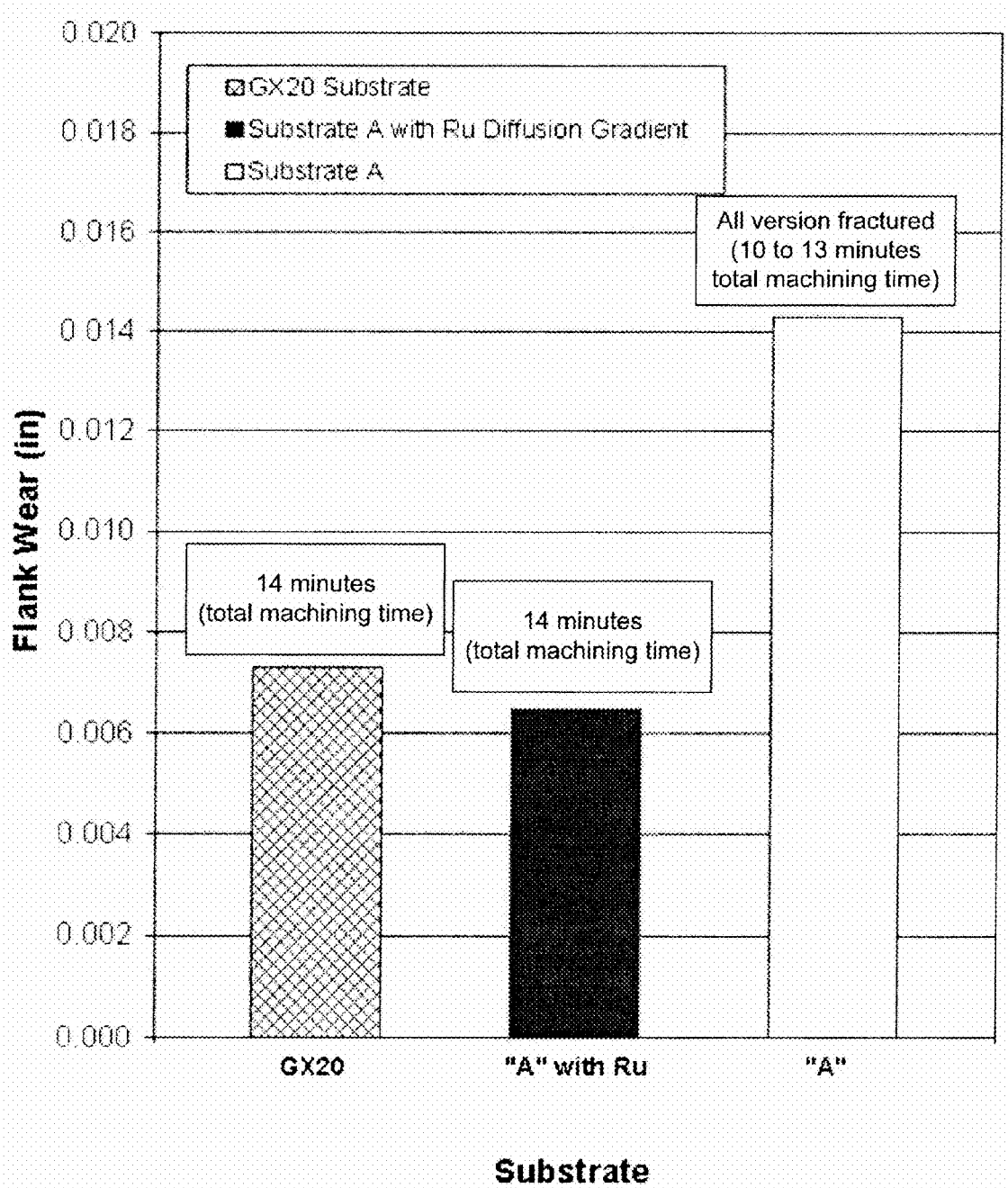
FIG. 4 is a bar graph comparing experimental results of a tool wear test for three (3) types of CVD-coated ADKT1505PDER-47 cutting inserts comprising different substrates and machining a Ti-6Al-4V workpiece.

The results of the wear testing are presented in FIG. 4. For each variant (GX20™ material substrate, Substrate A w/o Ru, Substrate A w/Ru), three replicate milling inserts were used to perform three replicate milling operations on the workpiece. The average of the three wear measurements for each variant is presented in FIG. 4. The milling inserts made from the baseline GX20™ material variant exhibited an average flank wear of 0.0073 inches. The milling inserts comprising Substrate A without ruthenium content exhibited an average wear of 0.0143 inches. The cutting inserts comprising Substrate A and having a near-surface ruthenium concentration gradient diffused into the binder of the cemented carbide substrate exhibited an average wear of 0.0065 inches. The cutting inserts comprising Substrate A with the ruthenium gradient exhibited an enhancement in wear resistance of 54.5% relative to the cutting inserts comprising Substrate A without ruthenium content. The cutting inserts comprising Substrate A with the ruthenium gradient exhibited an enhancement in wear resistance of 10.9% relative to the cutting inserts comprising GX20™ material.

Example 3

Three (3) different groups of TiN—TiC—TiN CVD coated milling inserts, each having a standard geometry designation APKT1604PDER-43, were used for tool wear testing involving milling a Ti-6Al-4V workpiece. The milling conditions are shown in Table 5. The three (3) groups of APKT1604PDER-43 milling inserts used to perform the tool wear testing each respectively comprised: (i) a GX20™ material substrate; (ii) Substrate B without a near-surface ruthenium concentration gradient; and (iii) Substrate B with a near-surface ruthenium concentration gradient.

Substrate B was produced from a tough grade cemented carbide powder that may be used to machine P45/K35 materials according to ISO standards. The nominal chemical composition and certain properties of Substrate B are shown in Table 2. The GX20™ cemented carbide milling inserts were prepared using powder metallurgy techniques similar to those described above in Example 1.

Figure 5:
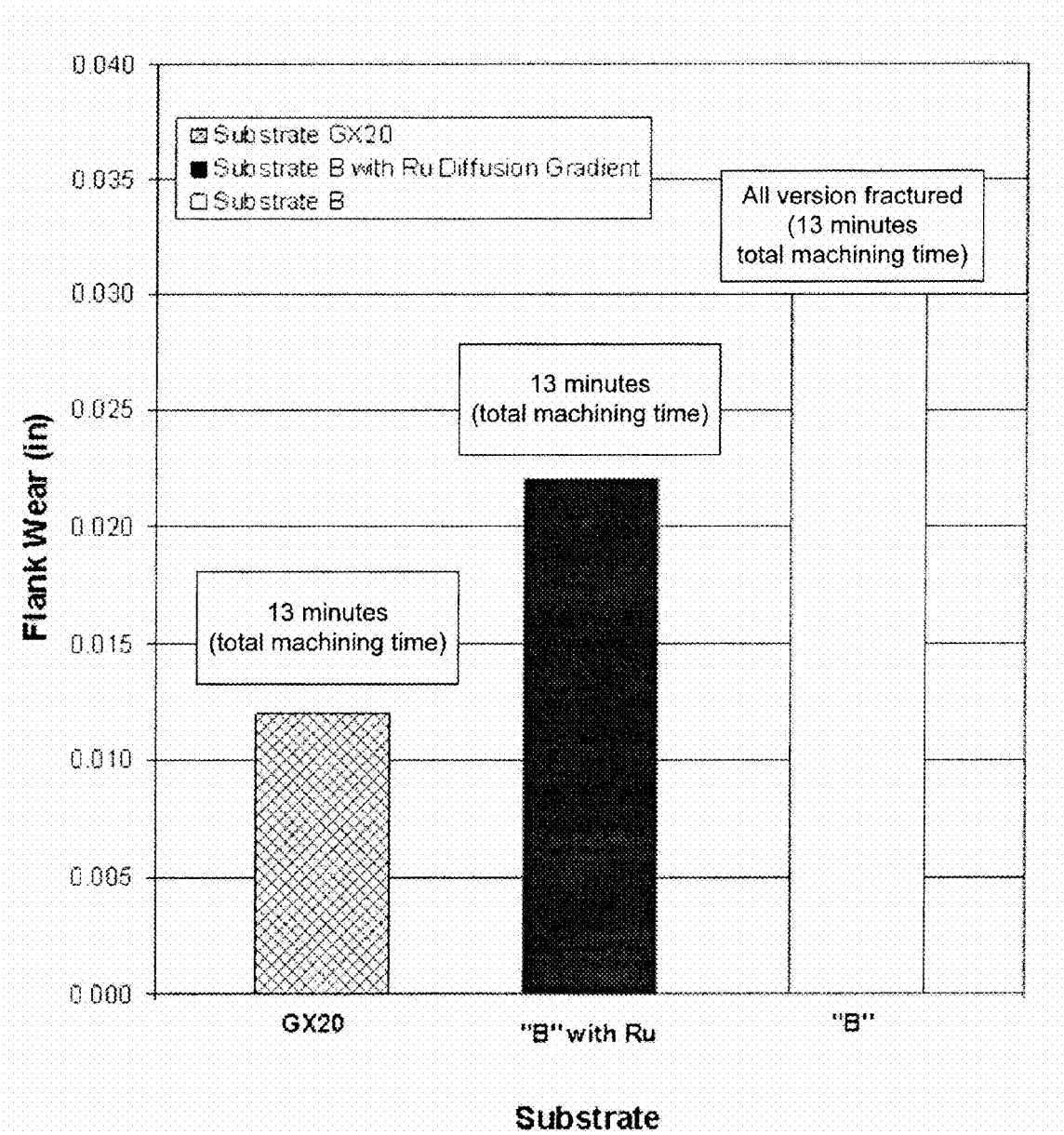
FIG. 5 is a bar graph comparing experimental results of a tool wear test for three (3) types of CVD-coated APKT1604PDER-43 cutting inserts comprising different substrates and machining a Ti-6Al-4V workpiece.

The results of the wear testing are presented in FIG. 5. For each variant (GX20™ material substrate, Substrate B w/o Ru, Substrate B w/Ru), three replicate milling inserts were used to perform three replicate milling operations on the workpiece. The average of the three wear measurements for each variant is presented in FIG. 5. The milling inserts comprising the baseline GX20™ material variant exhibited an average flank wear of 0.012 inches. The milling inserts comprising Substrate B without ruthenium content exhibited an average wear of 0.030 inches. The cutting inserts comprising Substrate B and having a near-surface ruthenium concentration gradient diffused into the binder of the cemented carbide substrate exhibited an average wear of 0.022 inches. The cutting inserts comprising Substrate B with the ruthenium gradient exhibited an enhancement in wear resistance of 26.7% relative to the cutting inserts comprising Substrate B without ruthenium content.

Example 4

Three (3) different groups of TiN—TiC—TiN CVD coated milling inserts, each having a standard geometry designation XDLT120508ER-D41, were used for tool wear testing involving milling a Ti-6Al-4V workpiece. The milling conditions are shown in Table 5. The three (3) groups of XDLT120508ER-D41 milling inserts used to perform the tool wear testing each respectively comprised: (i) a GX20™ material substrate; (ii) Substrate C without a near-surface ruthenium concentration gradient; and (iii) Substrate C with a near-surface ruthenium concentration gradient.

Substrate C was produced from a tough grade cemented carbide powder that may be used to machine P45/K35 materials according to ISO standards. The nominal chemical composition and certain properties of Substrate C are shown in Table 2. The GX20™ cemented carbide milling inserts were prepared using powder metallurgy techniques similar to those described above in Example 1.

Figure 6:
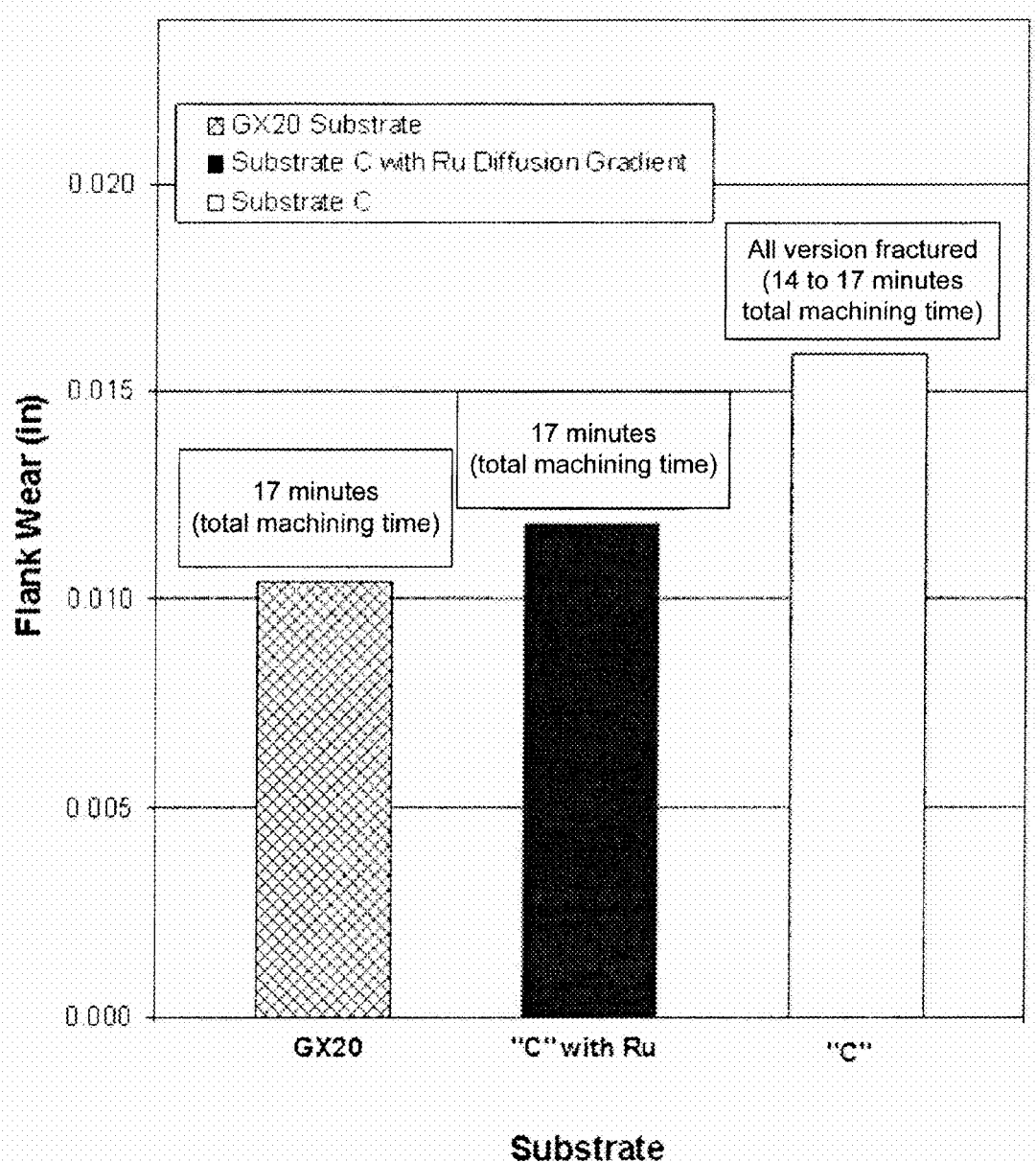
FIG. 6 is a bar graph comparing experimental results of a tool wear test for three (3) types of CVD-coated XDLT120508ER-D41 cutting inserts comprising different substrates and machining a Ti-6Al-4V workpiece.

The results of the wear testing are presented in FIG. 6. For each variant (GX20™ material substrate, Substrate C w/o Ru, Substrate C w/Ru), three replicate milling inserts were used to perform three replicate milling operations on the workpiece. The average of the three wear measurements for each variant is presented in FIG. 6. The milling inserts comprising the baseline GX20™ material variant exhibited an average flank wear of 0.0104 inches. The milling inserts comprising Substrate C without ruthenium content exhibited an average wear of 0.0159 inches. The cutting inserts comprising Substrate C and having a near-surface ruthenium concentration gradient diffused into the binder of the cemented carbide substrate exhibited an average wear of 0.0118 inches. The cutting inserts comprising Substrate C with the ruthenium gradient exhibited an enhancement in wear resistance of 25.8% relative to the cutting inserts comprising Substrate C without ruthenium content.

Example 5

Three (3) different groups of TiN—TiC—TiN CVD coated milling inserts, each having a standard geometry designation XDLT120508ER-D41, were used for tool wear testing involving milling a Ti-6Al-4V workpiece. The milling conditions are shown in Table 5. The three (3) groups of XDLT120508ER-D41 milling inserts used to perform the tool wear testing each respectively comprised: (i) a GX20™ material substrate; (ii) Substrate D without a near-surface ruthenium concentration gradient; and (iii) Substrate D with a near-surface ruthenium concentration gradient.

Substrate D was produced from a tough grade cemented carbide powder that may be used to machine P45/K35 materials according to ISO standards. The nominal chemical composition and certain properties of Substrate D are shown in Table 2. The GX20™ cemented carbide milling inserts were prepared using powder metallurgy techniques similar to those described above in Example 1.

Figure 7:
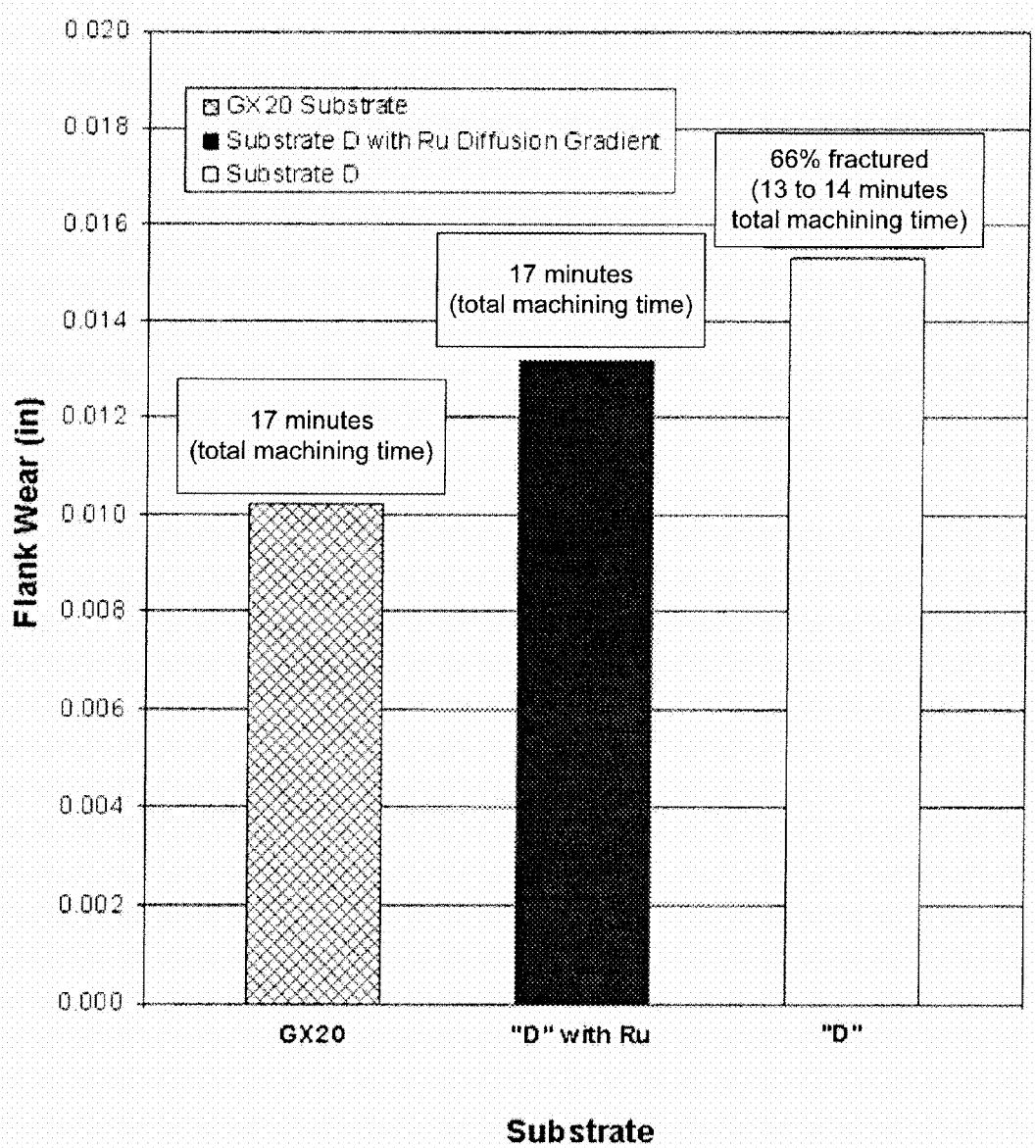
FIG. 7 is a bar graph comparing experimental results of a tool wear test for three (3) types of CVD-coated XDLT120508ER-D41 cutting inserts comprising different substrates and machining a Ti-6Al-4V workpiece.

The results of the wear testing are presented in FIG. 7. For each variant (GX20™ material substrate, Substrate D w/o Ru, Substrate D w/Ru), three replicate milling inserts were used to perform three replicate milling operations on the workpiece. The average of the three wear measurements for each variant is presented in FIG. 7. The milling inserts comprising the baseline GX20™ material variant exhibited an average flank wear of 0.0102 inches. The milling inserts comprising Substrate D without ruthenium content exhibited an average wear of 0.0153 inches. The cutting inserts comprising Substrate D and having a near-surface ruthenium concentration gradient diffused into the binder of the cemented carbide substrate exhibited an average wear of 0.0132 inches. The cutting inserts comprising Substrate D with the ruthenium gradient exhibited an enhancement in wear resistance of 13.7% relative to the cutting inserts comprising Substrate D without ruthenium content.

Example 6

Eighteen (18) different groups of TiN—TiCN—$Al_2O_3$—TiN CVD coated turning inserts, each having a standard geometry designation CNMG432-4T, were used for tool wear testing involving turning a 4340 steel workpiece. The turning conditions are shown in Table 5. The 18 groups of CNMG432-4T turning inserts used to perform the tool wear testing each respectively comprised one (1) of the nine (9) Substrates F-N, a first set without ruthenium gradients and a second set with near-surface ruthenium concentration gradients.

Substrates F-N comprise cemented carbide powders that may be used to prepare a wide range of grades for use in machining P05/K05 to P40/K40 materials according to ISO standards. The nominal chemical composition and certain properties of Substrates F-N are shown in Table 2.

Figure 8:
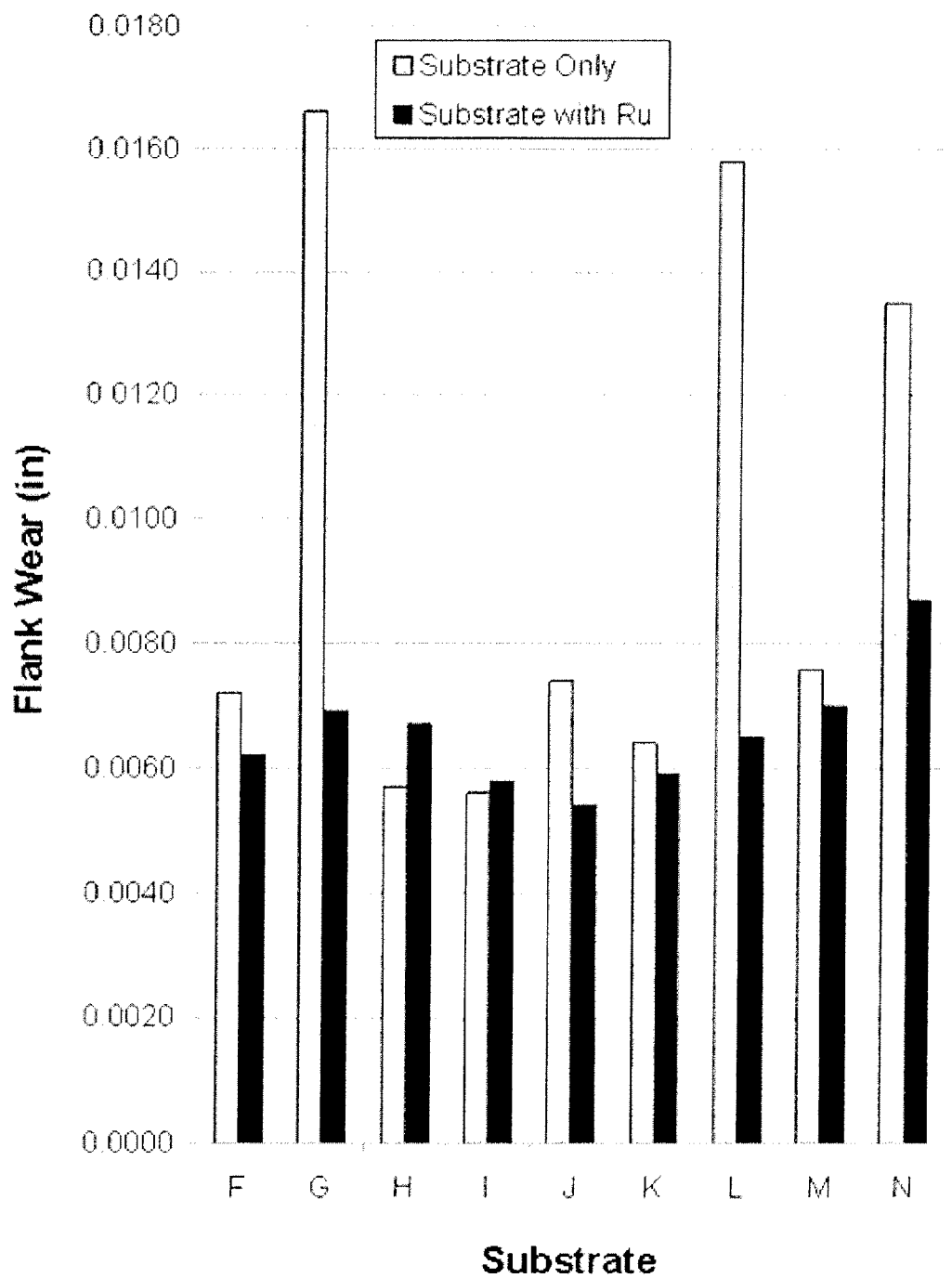
FIG. 8 is a bar graph comparing experimental results of a tool wear test for eighteen (18) types of CVD-coated CNMG432-4T cutting inserts comprising different substrates and machining a 4340 steel workpiece.

The results of the wear testing are presented in FIG. 8. For each variant (Substrates F-N, with and without a Ru gradient), one turning operation was performed on a workpiece. The turning inserts having a near-surface ruthenium gradient and comprising Substrates F, G, and J-N exhibited enhanced wear resistance relative to turning inserts comprising the Substrates without ruthenium content. The average decease in flank wear exhibited by the inserts comprising Substrates F, G, and J-N and a ruthenium gradient was approximately 30%.

Example 7

Eight (8) different groups of TiAlN PVD coated turning inserts, each having a standard geometry designation CNMG432-4E, were used for tool wear testing involving turning a Ti-6Al-4V workpiece. The turning conditions are shown in Table 5. The 8 groups of CNMG432-4E turning inserts used to perform the tool wear testing each respectively comprised one of the four Substrates 1-4, a first set without ruthenium content and a second set with a near-surface ruthenium concentration gradient.

Substrates 1-4 were made from cemented carbide powders that may be used to prepare a wide range of grades for use in machining P01/K05/S01 to P15/K25/S10 materials according to ISO standards. The nominal chemical composition and certain properties of Substrates 1-4 are shown in Table 2.

Figure 9:
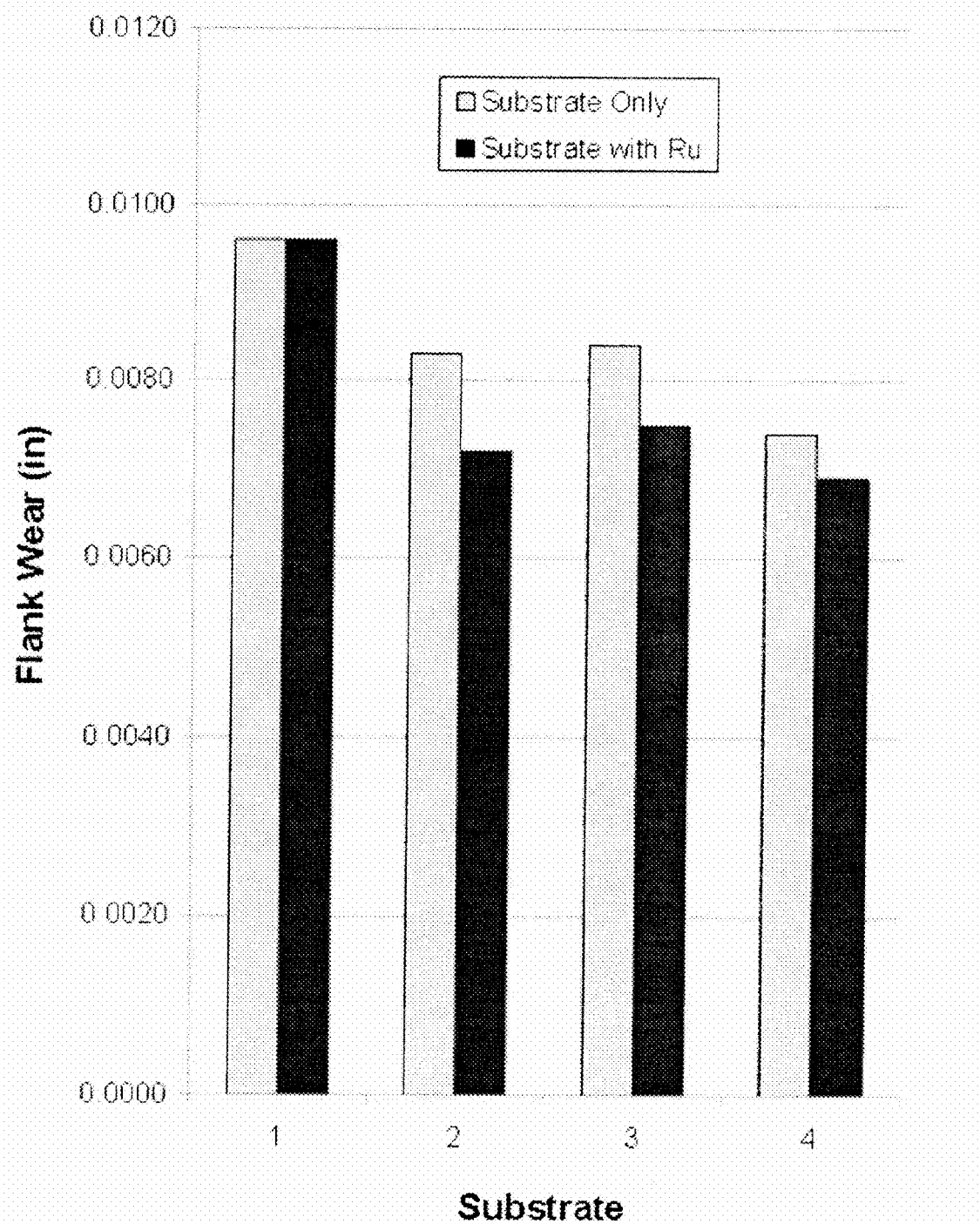
FIG. 9 is a bar graph comparing experimental results of a tool wear test for eight (8) types of CVD-coated CNMG432-4E cutting inserts comprising different substrates and machining a Ti-6Al-4V workpiece.

The results of the wear testing are presented in FIG. 9. For each variant (Substrates 1-4, with and without a Ru gradient), three replicate turning inserts were used to perform three replicate turning operations on a workpiece. The average of the three wear measurements for each variant is presented in FIG. 9. The turning inserts having a near-surface ruthenium gradient and Substrates 2-4 exhibited enhanced wear resistance relative to turning inserts comprising the Substrates without ruthenium content. The average decease in flank wear exhibited by the inserts comprising Substrates 2-4 and a ruthenium gradient was approximately 10%.

Example 8

Two (2) different groups of TiN—TiCN-αAl$_2$O$_3$—TiCN—TiN CVD coated turning inserts, each having a standard geometry designation RCMR96-4M, were used for tool wear testing involving turning a forged carbon steel railway wheel. The turning conditions are shown in Table 5. The 2 groups of RCMR96-4M turning inserts used to perform the tool wear testing each respectively comprised: (i) Substrate Z without ruthenium content; and (ii) Substrate Z with a near-surface ruthenium concentration gradient.

Substrate Z was made from cemented carbide powders that may be used to prepare a low cobalt grade for use in heavy duty machining requiring excellent high temperature deformation resistance. The nominal chemical composition and certain properties of Substrate Z are shown in Table 2.

Figure 10:
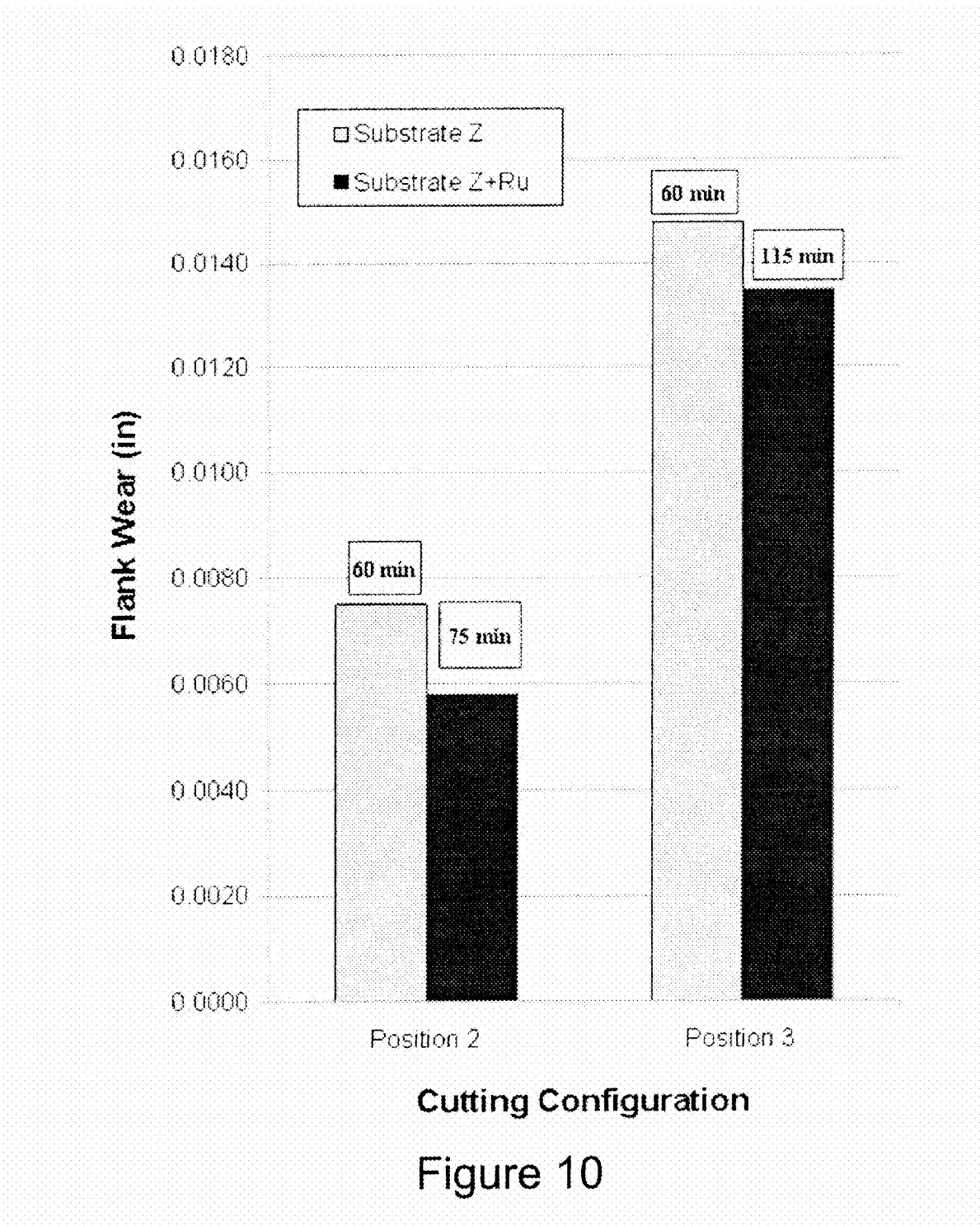
FIG. 10 is a bar graph comparing experimental results of a tool wear test for two (2) types of CVD-coated RCMR96S-4M cutting inserts comprising different substrates and machining two different areas of a 1036 steel workpiece.
Figure 11:
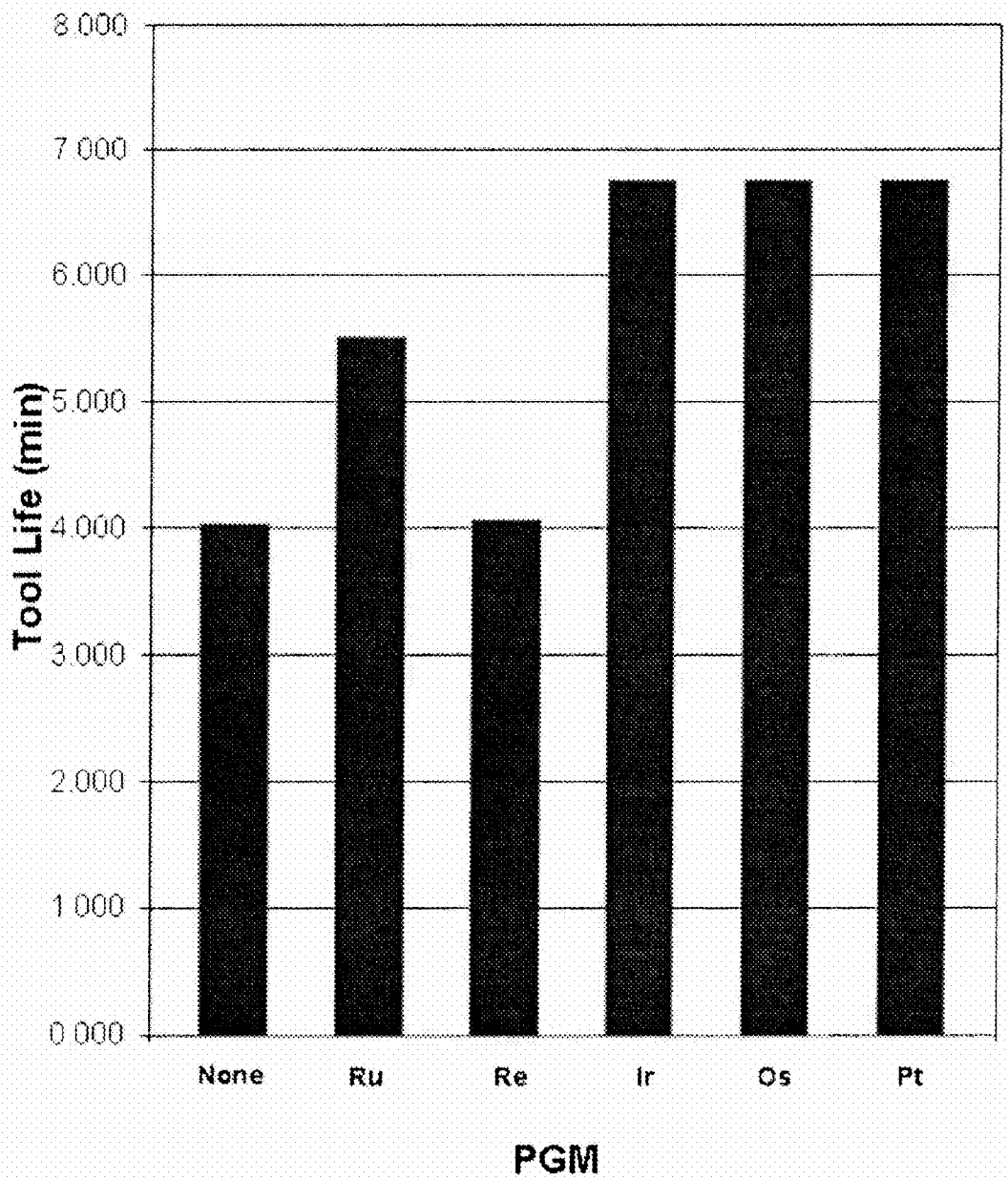
FIG. 11 is a bar graph comparing experimental results of a tool lifetime test for six (6) types of CVD-coated ADKT1505PDER-47 cutting inserts comprising different substrates and machining a Ti-6Al-4V workpiece.

The results of the wear testing are presented in FIG. 10. For each variant (Substrate Z with and without a Ru gradient), one insert was used to perform the turning operations on the wheels. The wear measurements for each variant is presented in FIG. 10. In addition, for each variant, two tests were performed using two different positions (2 and 3) on the wheel. Position 2 was the flange of the wheel, and position 3 was the back rim face of the wheel. The turning inserts comprising Substrate Z without ruthenium content exhibited average wear of 0.0075 inches and 0.0148 inches for a total machining time of 1 hour each at positions 2 and 3, respectively. The cutting inserts comprising Substrate Z and having a near-surface ruthenium concentration gradient diffused into the binder of the cemented carbide substrate exhibited average wear of 0.0058 inches and 0.0135 inches for total machining times of 75 minutes and 115 minutes at positions 2 and 3, respectively.

Due to the differences in tool life, the wear measurements cannot be compared directly. However, using linear interpolation to determine the equivalent amount of wear for the same tool life, the cutting inserts comprising Substrate Z with the ruthenium gradient exhibited an enhancement in wear resistance of approximately 62% and 67%, at positions 2 and 3 respectively, relative to the cutting inserts comprising Substrate Z without ruthenium content.

Example 9

Six (6) different groups of TiN—TiC—TiN CVD coated milling inserts, each having a standard geometry designation ADKT1505PDER-47, were used for tool life testing involving milling a Ti-6Al-4V workpiece. The workpiece material and the milling conditions are shown in Table 5. The 6 groups of ADKT1505PDER-47 milling inserts used to perform the tool life testing each respectively comprised Substrate A, one set without PGM content and five other sets each comprising a near-surface concentration gradient of ruthenium, rhenium, iridium, osmium, and platinum, respectively.

The results of the tool life testing are presented in FIG. 11. For each variant, one milling operation was performed. The milling insert comprising Substrate A without any PGM failed after approximately 4.1 minutes. The milling inserts comprising Substrate A having near-surface iridium, osmium, and platinum concentration gradients exhibited tool lives of over 6 minutes. The milling insert comprising Substrate A having a near-surface ruthenium concentration gradient exhibited a tool life of over 5 minutes. The milling insert comprising Substrate A having a near-surface rhenium concentration gradient exhibited a tool life about the same as the milling insert comprising Substrate A without any PGM.

The present disclosure has been written with reference to various exemplary, illustrative, and non-limiting embodiments. However, it will be recognized by persons having ordinary skill in the art that various substitutions, modifications or combinations of any of the disclosed embodiments (or portions thereof) may be made without departing from the scope of the invention as defined solely by the claims. Thus, it is contemplated and understood that the present disclosure embraces additional embodiments not expressly set forth herein. Such embodiments may be obtained, for example, by combining, modifying, or reorganizing any of the disclosed steps, ingredients, constituents, components, elements, features, aspects, and the like, of the embodiments described herein. Thus, this disclosure is not limited by the description of the exemplary and illustrative embodiments, but rather solely by the claims. In this manner, Applicant reserves the right to amend the claims during prosecution to add features as variously described herein.

What is claimed is:

1. A cutting tool comprising:
   a substrate comprising hard particles and a binder, the binder comprising a near-surface platinum group metal concentration gradient; and
   at least one wear resistant coating on at least a portion of the substrate.

2. The cutting tool of claim 1, wherein the platinum group metal comprises rhenium, ruthenium, osmium, rhodium, iridium, palladium, platinum, or combinations of any thereof.

3. The cutting tool of claim 1, wherein the hard particles comprise metal carbide, metal nitride, metal carbonitride, metal boride, metal silicide, metal oxide, or combinations of any thereof.

4. The cutting tool of claim 3, wherein the metal comprising the hard particles comprises titanium, chromium, vanadium, zirconium, hafnium, tantalum, molybdenum, niobium, tungsten, or combinations of any thereof.

5. The cutting tool of claim 1, wherein the binder comprises cobalt, nickel, iron, alloys of any thereof, or combinations of any thereof.

6. The cutting tool of claim 1, wherein the at least one wear resistant coating comprises a metal carbide, a metal nitride, a metal carbonitride, a metal boride, a metal silicide, a metal oxide, or a combination of any thereof.

7. The cutting tool of claim 6, wherein the metal comprising the wear resistant coating comprises titanium, chromium, vanadium, zirconium, hafnium, tantalum, molybdenum, niobium, tungsten, aluminum, boron, silicon, or combinations of any thereof.

8. The cutting tool of claim 1, wherein the near-surface platinum group metal concentration gradient comprises from 10 weight percent to 100 weight percent platinum group metal on a total binder weight basis at the substrate surface and zero to background levels of platinum group metal in a bulk region of the substrate.

9. The cutting tool of claim 1, wherein the near-surface platinum group metal concentration gradient comprises from 10 weight percent to 100 weight percent platinum group metal on a total binder weight basis at the substrate surface and decreases with depth to zero or background levels of platinum group metal.

10. The cutting tool of claim 1, wherein the near-surface platinum group metal concentration gradient comprises from 10 weight percent to 100 weight percent platinum group metal on a total binder weight basis at the substrate surface and decreases logarithmically with depth to zero or background levels of platinum group metal in a bulk region of the substrate.

11. The cutting tool of claim 1, wherein the at least one wear resistant coating has the characteristics of a coating applied by physical vapor deposition.

12. The cutting tool of claim 1, wherein the at least one wear resistant coating has the characteristics of a coating applied by chemical vapor deposition.

13. The cutting tool of claim 1, wherein the at least one wear resistant coating has a thickness of from 1 to 30 micrometers.

14. The cutting tool of claim 1, wherein the at least one wear resistant coating has a thickness of from 1 to 10 micrometers.

15. The cutting tool of claim 1, wherein the at least one wear resistant coating has a thickness of from 2 to 6 micrometers.

16. The cutting tool of claim 1, wherein the at least one wear resistant coating comprises two or more layers.

17. The cutting tool of claim 1, wherein the cutting tool is selected from a group consisting of a burr, an endmill, a drill, and an insert.

18. The cutting tool of claim 1, wherein the platinum group metal comprises rhenium, ruthenium, osmium, rhodium, iridium, or combinations of any thereof.

19. A cutting tool comprising:
a cemented carbide substrate comprising tungsten carbide particles and a cobalt binder, the binder comprising a near-surface platinum group metal concentration gradient of 10 weight percent to 100 weight percent platinum group metal on a total binder weight basis at the substrate surface and logarithmically decreasing with depth to background levels of platinum group metal;
wherein the platinum group metal is selected from the group consisting of ruthenium, osmium, rhodium, iridium, palladium, platinum, and combinations of any thereof; and
at least one wear resistant coating on at least a portion of the substrate, the coating comprising a metal carbide, metal nitride, metal carbonitride, metal boride, metal silicide, metal oxide, or combination of any thereof, of a group IIIA, group IVA, group IVB, group VB, or group VIIB metal.

20. The cutting tool of claim 19, wherein the cutting tool is selected from a group consisting of a burr, an endmill, a drill, and an insert.

21. The cutting tool of claim 19, wherein the platinum group metal comprises rhenium, ruthenium, osmium, rhodium, iridium, or combinations of any thereof.

* * * * *